(12) United States Patent
Richeson et al.

(10) Patent No.: US 7,860,672 B2
(45) Date of Patent: Dec. 28, 2010

(54) METHOD AND APPARATUS FOR MONITORING VOLTAGE IN A METER NETWORK

(75) Inventors: Keith Richeson, Cary, NC (US); Charlie E. Minton, III, Willow Spring, NC (US); Rodney C. Hemminger, Raleigh, NC (US); Robert T. Mason, Jr., Raleigh, NC (US)

(73) Assignee: Elster Electricity, LLC, Raleigh, NC (US)

( * ) Notice: Subject to any disclaimer, the term of this patent is extended or adjusted under 35 U.S.C. 154(b) by 267 days.

(21) Appl. No.: 12/140,938

(22) Filed: Jun. 17, 2008

(65) Prior Publication Data
US 2009/0167291 A1 Jul. 2, 2009

Related U.S. Application Data

(60) Provisional application No. 61/061,810, filed on Jun. 16, 2008, provisional application No. 61/016,760, filed on Dec. 26, 2007.

(51) Int. Cl.
*G06F 19/00* (2006.01)
(52) U.S. Cl. ....................................................... 702/61
(58) Field of Classification Search .................... 702/61, 702/64, 182–185, 188
See application file for complete search history.

(56) References Cited

U.S. PATENT DOCUMENTS

| 4,621,330 | A | 11/1986 | Weikel |
| 5,994,892 | A | 11/1999 | Turino et al. |
| 6,137,423 | A | 10/2000 | Glorioso et al. |
| 6,396,839 | B1 | 5/2002 | Ardalan et al. |
| 6,529,883 | B1 | 3/2003 | Yee et al. |
| 6,598,003 | B1 | 7/2003 | Heino et al. |
| 7,006,934 | B2 | 2/2006 | Jonker et al. |
| 2009/0228224 | A1* | 9/2009 | Spanier et al. ................. 702/60 |

OTHER PUBLICATIONS

A3 ALPHA® Meter; Elster, Raleigh, North Carolina; 2005, two pages; Elster web site http://www/elesterelectricity.com/en/a3_alpha.html.

* cited by examiner

*Primary Examiner*—Edward Raymond
(74) *Attorney, Agent, or Firm*—Woodcock Washburn LLP

(57) ABSTRACT

Methods and systems are provided for monitoring input voltages to meters that are in a wireless metering network. A plurality of entries can be created that include voltage-related information, such as a maximum input voltage or a minimum input voltage. Each meter can further determine whether the input voltage is beyond a predetermined threshold voltage for a duration that might indicate a voltage irregularity in the network. Each meter in the network can be monitored by a collector, which can communicate information to a data collection server.

24 Claims, 9 Drawing Sheets

METHOD AND APPARATUS FOR MONITORING VOLTAGE IN A METER NETWORK

CROSS-REFERENCE TO RELATED APPLICATIONS

This application claims priority to U.S. Patent Application No. 61/016,760 filed Dec. 26, 2007, and also claims priority to U.S. Patent Application No. 61/061,810 filed Jun. 16, 2008, the disclosure of each of which is hereby incorporated by reference as if set forth in their entirety herein.

BACKGROUND

The present invention relates to metering networks, and more particularly relates to monitoring status information of meters in a wireless metering network.

Utility companies conventionally read electric, gas and water meters using both fixed network and mobile RF technologies. Specifically, utility companies have historically measured and recorded energy and demand data associated with the various meters. More recently, meters have been provided with the capability to capture and record various data, such as voltage, current, instantaneous watts over a specific time interval. The data can then either be transmitted to the utility company or read remotely or locally by the utility company.

While conventional metering networks have proven useful for their intended purpose, it would be desirable to provide a metering network having meters that can be easily monitored for status conditions.

SUMMARY

In accordance with one aspect of the present invention, a method is provided for monitoring voltage in a meter. The meter can be one of a plurality of meters in a wireless metering network. The method can be performed at the meter, and includes the steps of sampling an input voltage, reading input voltages from the sampled input voltage, generating an indication when at least one of the input voltages is beyond a voltage threshold over an entirety of a duration, and wirelessly communicating the indication to a collector on the network.

In accordance with another aspect of the present invention, a system is provided for monitoring voltage in a wireless network of meters. The system can include a plurality of meters each receiving respective input voltages. Each meter samples an input voltage, and periodically determines voltage values from the sampled input voltage. Each meter can generate an indication when at least one of the average voltages is beyond a voltage threshold for a duration. The system further includes a collector that communicates wirelessly with each of the plurality of meters to form a fixed wireless metering network. The collector can receive generated indications from each of the plurality of meters, and can identify a select group of meters among the plurality of meters, wherein each of the select group of meters has reported an indication.

In accordance with yet another aspect of the present invention, a method is provided for monitoring a network of synchronized meters associated with a remote collector station on a meter network. The method can include the step of monitoring an input voltage at each meter. The monitoring step can include sampling the input voltage over a plurality of voltage log entry periods, determining an average input voltage at a configurable average rate, generating a threshold indication if the average input voltage is above a predetermined maximum voltage threshold or below a predetermined minimum voltage threshold for a predetermined validation duration, and generating a voltage log that includes at least one voltage log entry during each voltage log entry period. The voltage log entry can include a determined maximum average voltage and an associated timestamp, and a determined minimum average voltage and an associated timestamp. The method can further include the step of monitoring each meter at the remote collector station. The monitoring step can include reading at least a portion of the voltage log of each of meter, and identifying a group of meters that have generated the threshold indication among the plurality of meters.

In accordance with still another aspect of the present invention, a method is provided for monitoring voltage in a meter, wherein the meter is one of a plurality of meters in a wireless metering network. The method can be performed at each meter, and includes the steps of sampling an input voltage over a voltage log entry period, and generating a voltage log entry corresponding to the voltage log entry period, wherein the voltage log entry includes a stored minimum input voltage and a stored maximum input voltage. The method further includes the steps of continuously determining whether the sampled input voltage is less than the minimum input voltage, or greater than the maximum input voltage, updating the stored minimum input voltage when the sampled input voltage is less than the stored minimum input voltage, updating the stored maximum input voltage when the sampled input voltage is greater than the stored maximum input voltage, and wirelessly communicating the stored minimum and maximum input voltages to a collector on the network.

BRIEF DESCRIPTION OF THE DRAWINGS

The foregoing summary, as well as the following detailed description, is better understood when read in conjunction with the appended drawings. There is shown in the drawings example embodiments of various embodiments, however the present invention is not limited to the specific methods and instrumentalities disclosed. In the drawings.

DETAILED DESCRIPTION OF ILLUSTRATIVE EMBODIMENTS

Figure 1:
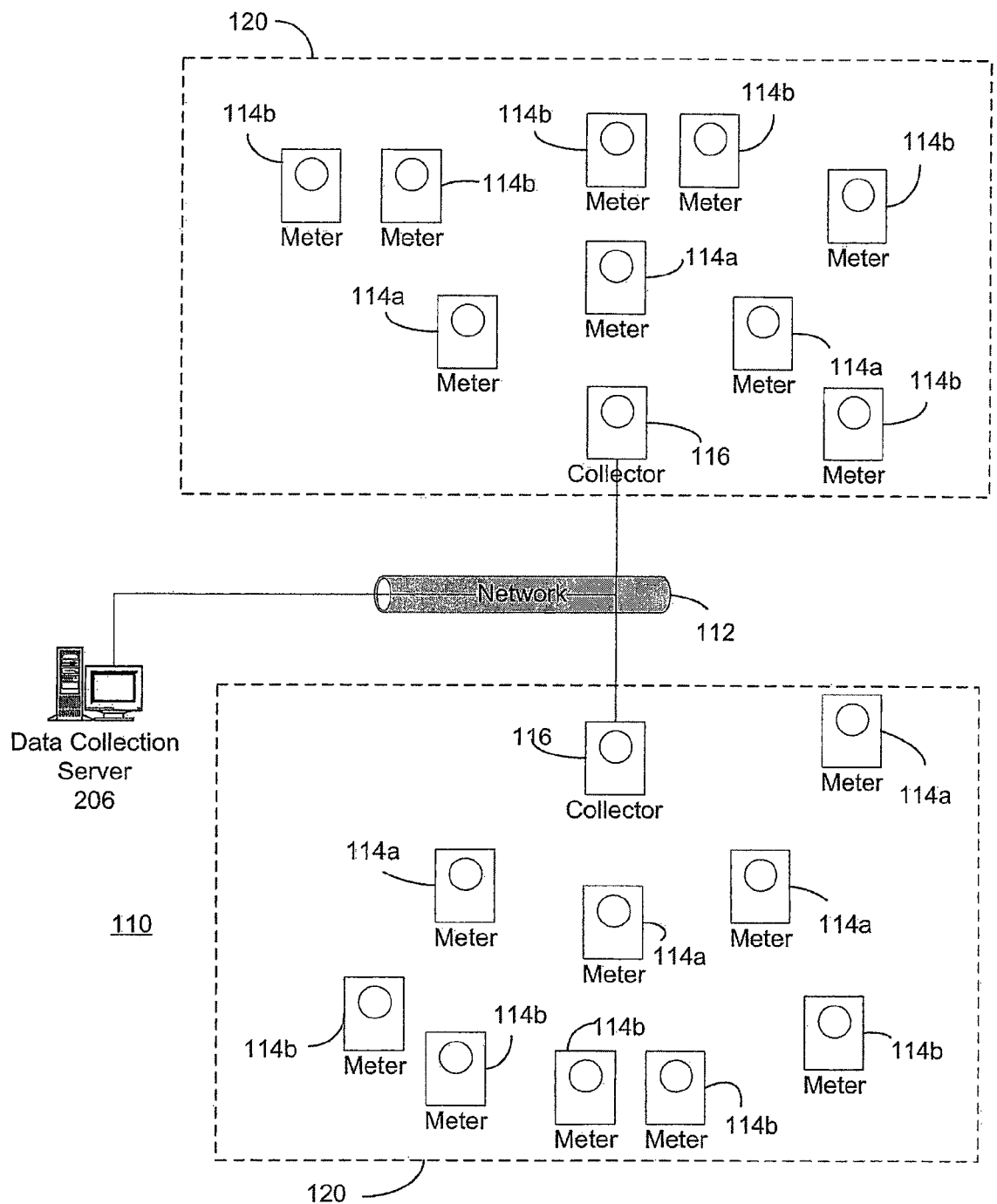
FIG. 1 is a diagram of an example metering system.

Referring to FIG. 1, an example communication system 110 employs wireless frequency hopping spread spectrum (FHSS) communications to communicate between nodes. In particular, the example communication system 110 is a metering system that comprises a plurality of meters 114, which are operable to sense and record consumption or usage of a service or commodity such as, for example, electricity, water, or gas. It is understood, however, that the present invention is by no means limited to use in a metering system, but rather can be employed in any communication system employing FHSS communications. Moreover, when employed in a meter system, the invention is not limited to use in a fixed network such as that illustrated in FIG. 1, but can also be employed in a mobile network, such as walk-by/drive-by metering systems.

The meters 114 can be located at customer premises such as, for example, a home or place of business. The meters 114 include circuitry for measuring the consumption of the service or commodity being consumed at their respective locations, and generating data reflecting the consumption, as well as other related data. The meters 114 can also include circuitry for wirelessly transmitting data generated by the meter to a remote location. The meters 114 can further include circuitry for receiving data, commands or instructions wirelessly as well. Meters that are operable to both receive and transmit data can be referred to as "bi-directional" or "two-way" meters, while meters that are only capable of transmitting data can be referred to as "transmit-only" or "one-way" meters. In bi-directional meters, the circuitry for transmitting and receiving can include a transceiver. In an illustrative embodiment, the meters 114 can be, for example, electricity meters manufactured by Elster Electricity, LLC and marketed under the tradename REX.

The system 110 further includes one or more collectors 116. In one embodiment, the collectors 116 can be meters that are operable to detect and record usage of a service or commodity such as, for example, electricity, water, or gas. In addition, the collectors 116 are operable to send data to and receive data from meters 114. Thus, like the meters 114, the collectors 116 can comprise both circuitry for measuring the consumption of a service or commodity and for generating data reflecting the consumption and circuitry for transmitting and receiving data. In one embodiment, collector 116 and meters 114 communicate with and amongst one another using a frequency hopping spread spectrum (FHSS) technique.

The system 110 can thus include a subnet or local area network (LAN) 120, which can be defined by a collector 116 and the meters 114 with which the collector 116 communicates. As used herein, the meters 114 and the collectors 116 can be referred to as "nodes" in the subnet 120. In each subnet/LAN 120, each meter 114 transmits data related to the commodity being metered at the meter's location. For instance, each meter can monitor and transmit data related to an input or line voltage received over a power network (not shown). The collector 116 receives the data transmitted by each meter 114, effectively "collecting" it, and then periodically transmits the data from all of the meters in the subnet/LAN 120 to a data collection server 206.

The data collection server 206 can be a specially programmed general purpose computing system and can communicate with the collectors 116 over a network 112. The network 112 can assume any suitable form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, a mesh network, a Wi-Fi (802.11) network, a Wi-Max (802.16) network, a land line (POTS) network, or any combination of the above.

The data collection server 206 is configured to store data received by the collectors 116 for analysis. For instance, in one aspect the data collection server 206 can prepare bills. In another example, the data collection server 206 can identify and locate status issues, for instance voltage integrity issues in the power network. In another aspect, each collector 116 can identify and locate the status issues among the meters 114 in the associated subnet/LAN 120.

Figure 2:
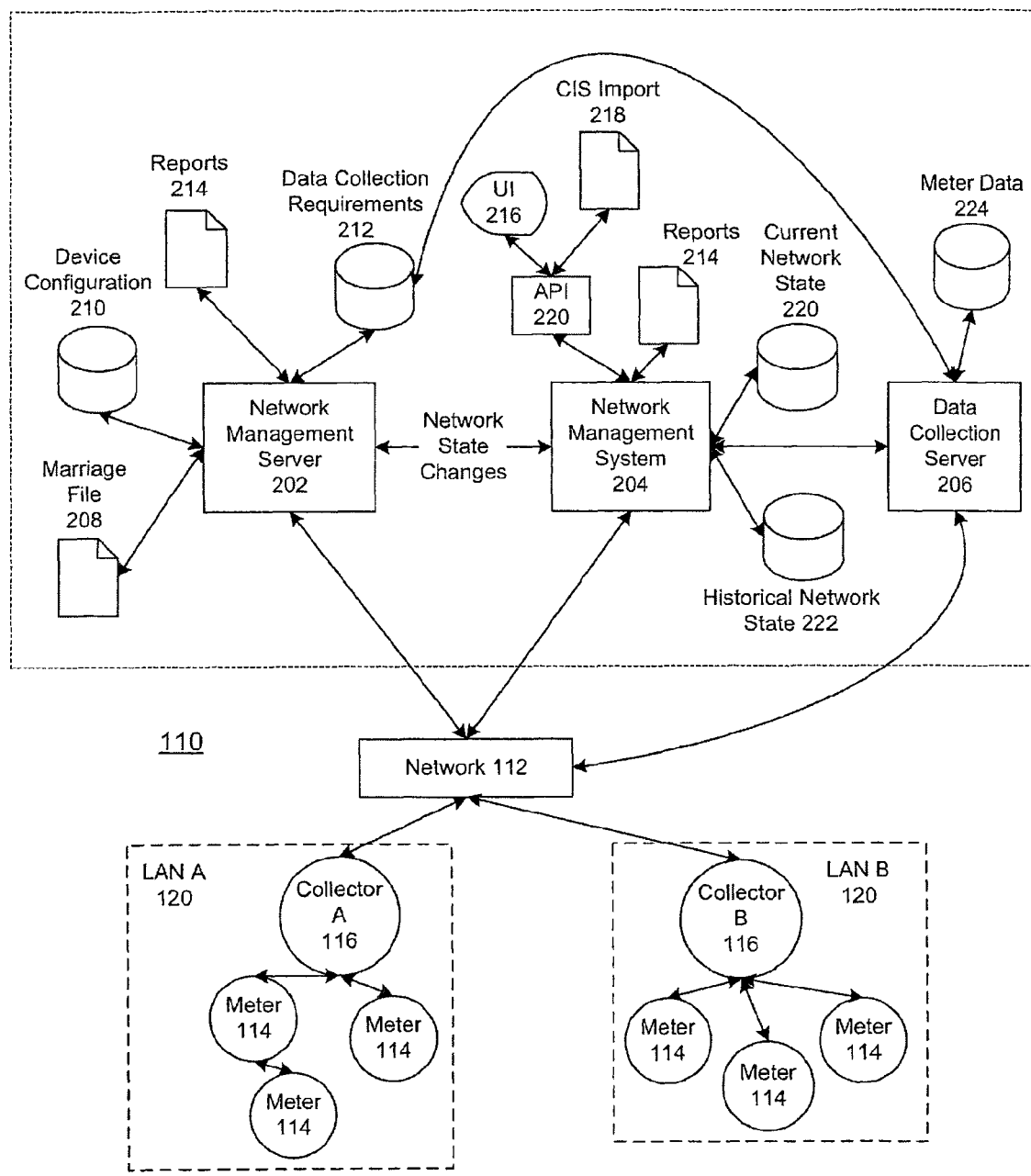
FIG. 2 expands upon the diagram of FIG. 1 and illustrates an example metering system in greater detail.

Referring now to FIG. 2, the communication system 110 includes a network management server 202, a network management system (NMS) 204 and the data collection server 206 that together manage one or more subnets/LANs 120 and their constituent nodes. The NMS 204 can track changes in the state of the network, such as new nodes registering and unregistering with the system 110, changes in communication paths, and the like. This information is collected for each subnet/LAN 120 and is detected and forwarded to the network management server 202 and the data collection server 206. Typically, the communication system 110 will be operated by a utility company or a company providing information technology services to a utility company.

Each of the meters 114 and collectors 116 is assigned an identifier (LAN ID) that uniquely identifies that meter or collector on its subnet/LAN 120. In this embodiment, communication between nodes (i.e., the collectors and meters) and the system 110 is accomplished using the LAN ID. However, operators of a utility can also query and communicate with the nodes using their own identifiers. To this end, a marriage file 208 can be used to correlate a utility's identifier for a node (e.g., a utility serial number) with both a manufacturer serial number (i.e., a serial number assigned by the manufacturer of the meter) and the LAN ID for each node in the subnet/LAN 120. In this manner, the utility can refer to the meters and collectors by the utilities identifier, while the system can employ the LAN ID for the purpose of designating particular meters during system communications.

The communication system 110 can further include a device configuration database 210 for storing configuration information related to the nodes. In the illustrated embodiment, the device configuration database 210 can include data regarding time of use (TOU) switchpoints, etc. for the meters 114 and collectors 116 communicating in the system 110. A data collection requirements database 212 that contains information regarding the data to be collected on a per node basis. For example, a utility can specify that metering data such as load profile, demand, TOU, etc. is to be collected from particular meter(s) 114a. Reports 214 containing information on the network configuration can be automatically generated or in accordance with a utility request.

The network management system (NMS) 204 maintains a database describing the current state of the global fixed network system (current network state 220) and a database describing the historical state of the system (historical network state 222). The current network state 220 contains data related to current meter-to-collector assignments, etc. for each subnet/LAN 120. The historical network state 222 is a database from which the state of the network at a particular point in the past can be reconstructed. The NMS 204 is responsible for, amongst other things, providing reports 214 about the state of the network. The NMS 204 can be accessed via an application programming interface (API) 220 that is exposed to a user interface 216 and a Customer Information System (CIS) 218. Other external interfaces can also be implemented. In addition, the data collection requirements stored in the database 212 can be set via the user interface 216 or CIS 218.

The data collection server 206 collects data from the nodes (e.g., collectors 116) and stores the data in a database 224. The data includes metering information, such as energy consumption and can be used for billing purposes, etc. by a utility provider.

The network management server 202, network management system 204 and data collection server 206 communicate with the nodes in each subnet/LAN 120 over the network 110.

Figure 3A:
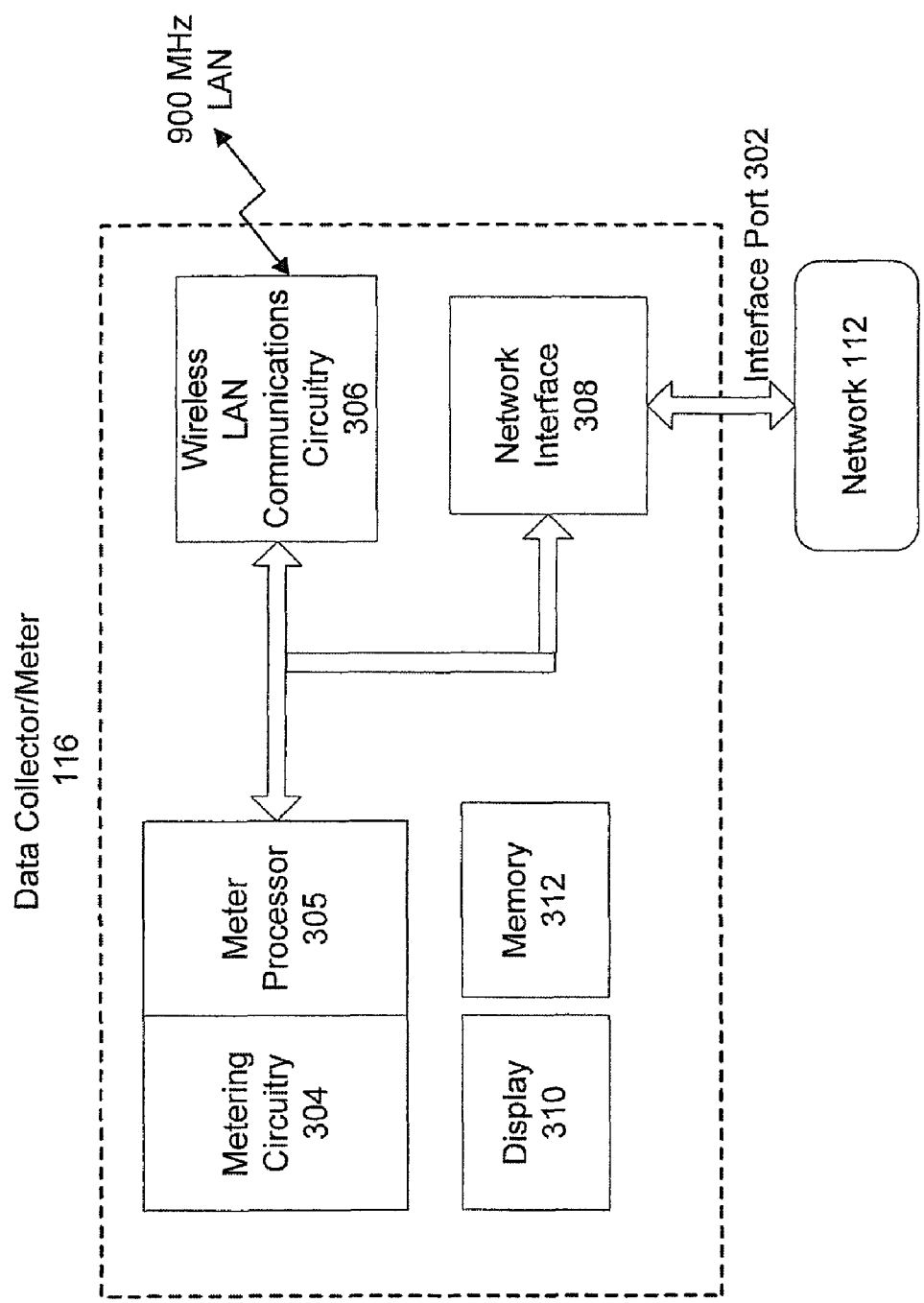
FIG. 3A is a block diagram illustrating an example collector.

Referring now to FIG. 3A, the collector 116 can include metering circuitry 304 that performs measurement of information related to a service or commodity, such as consumption, and a processor 305 that controls the overall operation of the metering functions of the collector 116. The collector 116 can further include a display 310 for displaying information such as measured quantities and meter status and a memory 312 for storing data. The collector 116 further comprises wireless LAN communications circuitry 306 for communicating wirelessly with the meters 114 in a subnet/LAN and a network interface 308 for communication over the network 112.

While FIG. 3A illustrates certain components of an example collector, it should be appreciated that the invention is not limited to such components. In fact, various other components typically found in an electronic meter can be a part of the collector 116, but have not been shown in FIG. 3A for the purposes of clarity. It should be further appreciated that the present invention can use other components to accomplish the operation of collector 116. The components that are shown and the functionality described for collector 116 are thus provided as examples, and are not meant to be exclusive of other components or other functionality.

In one embodiment, the metering circuitry 304, the processor 305, the display 310 and the memory 312 are implemented using an A3 ALPHA meter available from Elster Electricity, Inc. In that embodiment, the wireless LAN communications circuitry 306 can be implemented by a LAN Option Board (e.g., a 900 MHz two-way radio) installed within the A3 ALPHA meter, and the network interface 308 can be implemented by a WAN Option Board (e.g., a telephone modem) also installed within the A3 ALPHA meter. The WAN Option Board 308 can route messages from the network 112 (via interface port 302) to either the meter processor 305 or the LAN Option Board 306. The LAN Option Board 306 can use a transceiver (not shown), for example a 900 MHz radio, to communicate data to the meters 114. Also, the LAN Option Board 306 can have sufficient memory to store data received from the meters 114. This data can include, but is not limited to, current billing data (e.g., the present values stored and displayed by meters 114), previous billing period data, previous season data, load profile data, and status information, such as data related to line voltage integrity (as received from the meters 114).

The LAN Option Board 306 can be capable of synchronizing its time to a real time clock (not shown) in the A3 ALPHA meter, thereby synchronizing the LAN reference time to the time in the meter. The processing that carries out the communication functionality and the collection and storage of metering data of the collector 116 can be handled by the processor 305 and/or additional processors (not shown) in the LAN Option Board 306 and the WAN Option Board 308.

The responsibility of the collector 116 can be wide and varied. Generally, the collector 116 is responsible for managing, processing and routing data communicated between the collector 116 and the network 112, and between the collector 116 and the meters 114. The collector 116 can continually or intermittently read the current data from the meters 114 and store the data in a database (not shown) that resides in the collector 116. The database can be implemented as one or more tables of data within the collector 116. Such current data can include but is not limited to the total kWh usage, the Time-Of-Use (TOU) kWh usage, peak kW demand, and other energy consumption measurements and status information. The collector 116 also can read and store previous billing and previous season data from the meters 114 and store the data in the collector database.

In one embodiment, the LAN Option Board 306 employs a CC1110 chip available from Texas Instruments, Inc. to implement its wireless transceiver functionality. The CC1110 chip has a built-in Received Signal Strength Indication (RSSI) capability that provides a measurement of the power present in a received radio signal.

Figure 3B:
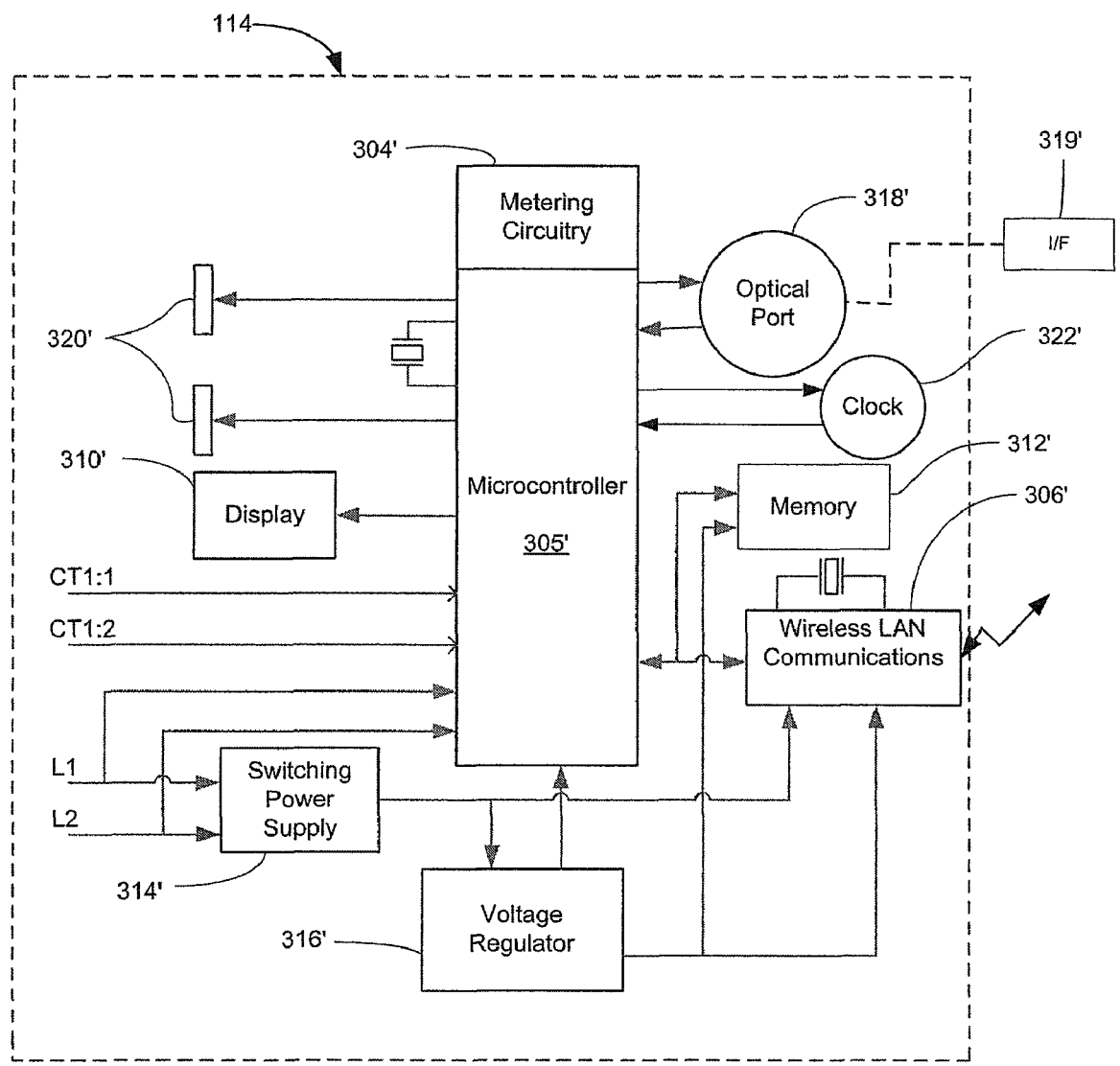
FIG. 3B is a block diagram illustrating an example meter.

Referring now to FIG. 3B, an example meter 114 suitable for operation in the communication system 110 can include metering circuitry 304' for measuring the amount of a service or commodity that is consumed and for monitoring status-related information such as line voltage across lines L1 and L2. The meter 114 can also include a processor 305' that controls the overall functions of the meter and receives current signals CT1:1 and CT1:2 from an off-board current transformer (CT). The processor 305' can communicate with a display 310' for displaying meter data and status information, and a memory 312' for storing data and program instructions. The processor 305' can further engage in two-way communications with an optical port 318' that can removably connect to an external electrical device, for instance a user interface 319'. Alternatively, the interface 319' can be hardwired into the meter 114. The interface 319' can enable a user to send control-related information such as configuration data to the microcontroller 305', and can receive signals from the microcontroller 305 and display information to the user. The processor 305' can send control signals to, and receive signals from, a clock 322'. The processor 305 can further communicate with a pair of connectors 320' that can attach to additional external devices.

The meter 114 can further include wireless communications circuitry 306' for transmitting and receiving data to/from other meters 114 or a collector 116. The wireless communication circuitry 306' can include, for example, the aforementioned CC1110 chip available from Texas Instruments, Inc.

The meter 114 can additionally include a switching power supply 314' that receives the input voltage lines L1 and L2, provides a regulated dc voltage (for instance 4.5V) for the amplifier in the wireless communication circuitry 306' and also for a voltage regulator 316'. The voltage regulator can step the voltage down to, for instance, 3.3V, and can send the stepped down voltage to the wireless communication circuitry 306', the microcontroller 305', and the memory 312'.

Referring again to FIG. 1, in the example embodiment shown, a collector 116 directly communicates with only a subset of the plurality of meters 114 in its particular subnet/LAN. Meters 114 with which collector 116 directly communicates can be referred to as "level one" meters 114*a*. The level one meters 114*a* are said to be one "hop" from the collector 116. Communications between collector 116 and meters 114 other than level one meters 114a are relayed through the level one meters 114a. Thus, the level one meters 114a operate as repeaters for communications between collector 116 and meters 114 located further away in subnet 120.

Each level one meter 114a typically will only be in range to directly communicate with only a subset of the remaining meters 114 in the subnet 120. The meters 114 with which the level one meters 114a directly communicate can be referred to as level two meters 114b. Level two meters 114b are one "hop" from the level one meters 114a, and therefore two "hops" from the collector 116. The level two meters 114b operate as repeaters for communications between the level one meters 114a and the meters 114 located further away from collector 116 in the subnet 120.

While only three levels of meters are shown (collector 116, first level 114a, second level 114b) in FIG. 1, a subnet 120 can comprise any number of levels of meters 114. For example, a subnet 120 can comprise one level of meters 114 but might also comprise eight or more levels of meters 114. In an embodiment wherein a subnet comprises eight levels of meters 114, as many as 1024 meters might be registered with a single collector 116.

As mentioned above, each meter 114 and collector 116 that is installed in the system 110 has a unique identifier (LAN ID) stored thereon that uniquely identifies the device from all other devices in the system 110. Additionally, meters 114 operating in a subnet 120 include information such as: data identifying the collector with which the meter is registered; the level in the subnet at which the meter is located; the repeater meter at the prior level with which the meter communicates to send and receive data to/from the collector; an identifier indicating whether the meter is a repeater for other nodes in the subnet; and if the meter operates as a repeater, the identifier that uniquely identifies the repeater within the particular subnet, and the number of meters for which it is a repeater. Collectors 116 have stored thereon all of this same data for all meters 114 that are registered therewith. Thus, the collector 116 comprises data identifying all nodes registered therewith as well as data identifying the registered path by which data is communicated from the collector to each node. Each meter 114 therefore has a designated communications path to the collector that is either a direct path (e.g., all level one nodes) or an indirect path through one or more intermediate nodes that serve as repeaters.

Information is transmitted in this embodiment in the form of packets. For most network tasks such as, for example, reading meter data, the collector 116 communicates with the meters 114 in the subnet 120 using point-to-point transmissions. For example, a message or instruction from the collector 116 is routed through the designated set of repeaters to the desired meter 114. Similarly, a meter 114 communicates with the collector 116 through the same set of repeaters, but in reverse.

In some instances, however, the collector 116 can need to quickly communicate information to all meters 114 located in its subnet 120. Accordingly, collector 116 can issue a broadcast message that is meant to reach all nodes in the subnet 120. The broadcast message can be referred to as a "flood broadcast message." A flood broadcast originates at the collector 116 and propagates through the entire subnet 120 one level at a time. For example, the collector 116 can transmit a flood broadcast to all first level meters 114a. The first level meters 114a that receive the message pick a random time slot and retransmit the broadcast message to the second level meters 114b. Any second level meter 114b can accept the broadcast, thereby providing better coverage from the collector out to the end point meters. Similarly, the second level meters 114b that receive the broadcast message pick a random time slot and communicate the broadcast message to the third level meters. This process continues out until the broadcast message is received by the end nodes of the subnet. Thus, a broadcast message gradually propagates outward from the collector to the nodes of the subnet 120.

The flood broadcast packet header contains information to prevent nodes from repeating the flood broadcast packet more than once per level. For example, within a flood broadcast message, a field might exist that indicates to meters/nodes which receive the message, the level of the subnet the message is located; only nodes at that particular level can re-broadcast the message to the next level. If the collector broadcasts a flood message with a level of 1, only level 1 nodes can respond. Prior to re-broadcasting the flood message, the level 1 nodes increment the field to 2 so that only level 2 nodes respond to the broadcast. Information within the flood broadcast packet header ensures that a flood broadcast will eventually die out.

Generally, a collector 116 issues a flood broadcast several times, e.g. five times, successively to increase the probability that all meters in the subnet 120 receive the broadcast. A delay is introduced before each new broadcast to allow the previous broadcast packet time to propagate through all levels of the subnet.

Referring again also to FIG. 3B, meters 114 often undergo power interruptions that can interfere with the operation of any clock therein. Accordingly, the clocks 322' internal to meters 114 cannot be relied upon to provide an accurate time reading. Having the correct time is necessary, however, when time of use metering is being employed. Indeed, in an embodiment, time of use schedule data can also be comprised in the same broadcast message as the time. Accordingly, the collector 116 periodically flood-broadcasts the real time to meters 114 in the associated subnet 120. The meters 114 use the time broadcasts to stay synchronized with the rest of the subnet 120. In an illustrative embodiment, the collector 116 broadcasts the time every 15 minutes. The broadcasts can be made near the middle of 15 minute clock boundaries that are used in performing load profiling and time of use (TOU) schedules so as to minimize time changes near these boundaries. Because maintaining time synchronization can be a high priority, lower priority tasks performed by collector 116 can be delayed while the time broadcasts are performed.

In an illustrative embodiment, the flood-broadcasts transmitting time data can be repeated, for example, five times, so as to increase the probability that all nodes receive the time. Furthermore, where time of use schedule data is communicated in the same transmission as the timing data, the subsequent time transmissions allow a different piece of the time of use schedule to be transmitted to the nodes.

Exception messages are used in the subnet 120 to transmit unexpected events that occur at the meters 114 to the collector 116. In an embodiment, the first 4 seconds of every 32-second period are allocated as an exception window for the meters 114 to transmit exception messages. The meters 114 transmit their exception messages early enough in the exception window so the message has time to propagate to the associated collector 116 before the end of the exception window. The collector 116 can process the exceptions after the 4-second exception window. Generally, the associated collector 116 acknowledges exception messages, and the collector 116 waits until the end of the exception window to send this acknowledgement.

In an illustrative embodiment, exception messages are configured as one of three different types of exception messages: local exceptions, which are handled directly by the collector 116 without intervention from the data collection server 206; an immediate exception, which is generally relayed to the data collection server 206 under an expedited schedule; and a daily exception, which is communicated to the communication server 122 on a regular schedule.

Exceptions are processed as follows. When an exception is received at the collector 116, the collector 116 identifies the type of exception that has been received. If a local exception has been received, the collector 116 takes an action to remedy the problem. For example, when the collector 116 receives an exception requesting a "node scan request" such as discussed below, the collector 116 transmits a command to initiate a scan procedure to the meter 114 from which the exception was received.

If an immediate exception type has been received, the collector 116 makes a record of the exception. An immediate exception might identify, for example, that there has been a power outage. The collector 116 can log the receipt of the exception in one or more tables or files. In an illustrative example, a record of receipt of an immediate exception is made in a table referred to as the "Immediate Exception Log Table." The collector 116 then waits a set period of time before taking further action with respect to the immediate exception. For example, the collector 116 can wait 64 seconds. This delay period allows the exception to be corrected before communicating the exception to the data collection server 206. For example, where a power outage was the cause of the immediate exception, the collector 116 can wait a set period of time to allow for receipt of a message indicating the power outage has been corrected.

If the exception has not been corrected, the collector 116 communicates the immediate exception to the data collection server 206. For example, the collector 116 can initiate a dial-up connection with the data collection server 206 and download the exception data. After reporting an immediate exception to the data collection server 206, the collector 116 can delay reporting any additional immediate exceptions for a period of time such as ten minutes. This is to avoid reporting exceptions from other meters 114 that relate to, or have the same cause as, the exception that was just reported.

If a daily exception was received, the exception is recorded in a file or a database table. Generally, daily exceptions are occurrences in the subnet 120 that need to be reported to the data collection server 206, but are not so urgent that they need to be communicated immediately. For example, when the collector 116 registers a new meter 114 in the subnet 120, the collector 116 records a daily exception identifying that the registration has taken place. In an illustrative embodiment, the exception is recorded in a database table referred to as the "Daily Exception Log Table." The collector 116 communicates the daily exceptions to the data collection server 206. Generally, the collector 116 communicates the daily exceptions once every 24 hours.

In the present embodiment, a collector assigns designated communications paths to meters with bidirectional communication capability, and can change the communication paths for previously registered meters if conditions warrant. For example, when a collector 116 is initially brought into the system 110, it needs to identify and register the meters in its subnet 120. A "node scan" refers to a process of communication between a collector 116 and meters 114, whereby the collector 116 can identify and register new nodes in a subnet 120 and allow previously registered nodes to switch paths. A collector 116 can implement a node scan on the entire subnet, referred to as a "full node scan," or a node scan can be performed on specially identified nodes, referred to as a "node scan retry."

A full node scan can be performed, for example, when a collector 116 is first installed. The collector 116 must identify and register nodes from which it will collect usage data. The collector 116 initiates a node scan by broadcasting a request, which can be referred to as a Node Scan Procedure request. Generally, the Node Scan Procedure request directs that all unregistered meters 114 or nodes that receive the request respond to the collector 116. The request can comprise information such as the unique address of the collector that initiated the procedure. The signal by which the collector 116 transmits this request can have limited strength and therefore is detected only at those meters 114 that are in proximity of the collector 116. The meters 114 that receive the Node Scan Procedure request respond by transmitting their unique identifier as well as other data.

For each meter 114 from which the collector receives a response to the Node Scan Procedure request, the collector 116 tries to qualify the communications path to that meter 114 before registering the meter with the collector. That is, before registering a meter 114, the collector 116 attempts to determine whether data communications with the meter 114 will be sufficiently reliable.

In one embodiment, the collector 116 determines whether the communication path to a responding meter 114 is sufficiently reliable by comparing a Received Signal Strength Indication (RSSI) value (i.e., a measurement of the received radio signal strength) measured with respect to the received response from the meter to a selected threshold value. For example, the threshold value can be −60 dBm. RSSI values above this threshold would be deemed sufficiently reliable.

In another embodiment, qualification is performed by transmitting a predetermined number of additional packets to the meter, such as ten packets, and counting the number of acknowledgements received back from the meter. If the number of acknowledgments received is greater than or equal to a selected threshold (e.g., 8 out of 10), then the path is considered to be reliable. In other embodiments, a combination of the two qualification techniques can be employed.

If the qualification threshold is not met, the collector 116 can add an entry for the meter to a "Straggler Table." The entry includes the meter's LAN ID, its qualification score (e.g., 5 out of 10; or its RSSI value), its level (in this case level one) and the unique ID of its parent (in this case the collector's ID).

If the qualification threshold is met or exceeded, the collector 116 registers the node. Registering a meter 114 comprises updating a list of the registered nodes at the collector 116. For example, the list can be updated to identify the meter's system-wide unique identifier and the communication path to the node. The collector 116 also records the meter's level in the subnet (i.e. whether the meter is a level one node, level two node, etc.), whether the node operates as a repeater, and if so, the number of meters for which it operates as a repeater. The registration process further comprises transmitting registration information to the meter 114. For example, the collector 116 forwards to the meter 114 an indication that it is registered, the unique identifier of the collector with which it is registered, the level the meter exists at in the subnet, and the unique identifier of its parent meter that will server as a repeater for messages the meter can send to the collector. In the case of a level one node, the parent is the collector 116 itself. The meter 114 stores this data and begins to operate as part of the subnet by responding to commands from its associated collector 116.

Qualification and registration continues for each meter that responds to the collector's initial Node Scan Procedure request. The collector 116 can rebroadcast the Node Scan Procedure additional times so as to insure that all meters 114 that can receive the Node Scan Procedure have an opportunity for their response to be received and the meter qualified as a level one node at the collector 116.

The node scan process then continues by performing a similar process as that described above at each of the now registered level one nodes. This process results in the identification and registration of level two nodes. After the level two nodes are identified, a similar node scan process is performed at the level two nodes to identify level three nodes, and so on.

Specifically, to identify and register meters that will become level two meters, for each level one meter, in succession, the collector 116 transmits a command to the level one meter, which can be referred to as an "Initiate Node Scan Procedure" command. This command instructs the level one meter to perform its own node scan process. The request comprises several data items that the receiving meter can use in completing the node scan. For example, the request can comprise the number of timeslots available for responding nodes, the unique address of the collector that initiated the request, and a measure of the reliability of the communications between the target node and the collector. As described below, the measure of reliability can be employed during a process for identifying more reliable paths for previously registered nodes.

The meter 114 that receives the Initiate Node Scan Response request responds by performing a node scan process similar to that described above. More specifically, the meter 114 broadcasts a request to which all unregistered nodes can respond. The request comprises the number of timeslots available for responding nodes (which is used to set the period for the node to wait for responses), the unique address of the collector 116 that initiated the node scan procedure, a measure of the reliability of the communications between the sending node and the collector 116 (which can be used in the process of determining whether a meter's path can be switched as described below), the level within the subnet of the node sending the request, and an RSSI threshold (which can also be used in the process of determining whether a registered meter's path can be switched). The meter 114 issuing the node scan request then waits for and receives responses from unregistered nodes. For each response, the meter 114 stores in memory 312' the unique identifier of the responding meter 114. This information is then transmitted to the collector 116.

For each unregistered meter 114 that responded to the node scan issued by the level one meter 114a, the collector attempts again to determine the reliability of the communication path to that meter. In one embodiment, the collector 116 sends a "Qualify Nodes Procedure" command to the level one node which instructs the level one node to transmit a predetermined number of additional packets to the potential level two node and to record the number of acknowledgements received back from the potential level two node. This qualification score (e.g., 8 out of 10) is then transmitted back to the collector, which again compares the score to a qualification threshold. In other embodiments, other measures of the communications reliability can be provided, such as an RSSI value.

If the qualification threshold is not met, then the collector 116 adds an entry for the node in the Straggler Table, as discussed above. However, if there already is an entry in the Straggler Table for the node, the collector 116 will update that entry only if the qualification score for this node scan procedure is better than the recorded qualification score from the prior node scan that resulted in an entry for the node.

If the qualification threshold is met or exceeded, the collector 116 registers the node. Again, registering a meter 114 at level two comprises updating a list of the registered nodes at the collector 116. For example, the list can be updated to identify the meter's unique identifier and the level of the meter in the subnet. Additionally, the collector's 116 registration information is updated to reflect that the meter 114 from which the scan process was initiated is identified as a repeater (or parent) for the newly registered node. The registration process further comprises transmitting information to the newly registered meter as well as the meter that will serve as a repeater for the newly added node. For example, the node that issued the node scan response request is updated to identify that it operates as a repeater and, if it was previously registered as a repeater, increments a data item identifying the number of nodes for which it serves as a repeater. Thereafter, the collector 116 forwards to the newly registered meter 114 an indication that it is registered, an identification of the collector 116 with which it is registered, the level the meter exists at in the subnet, and the unique identifier of the node that will serve as its parent, or repeater, when it communicates with the collector 116.

The collector 116 then performs the same qualification procedure for each other potential level two node that responded to the level one node's node scan request. Once that process is completed for the first level one node, the collector 116 initiates the same procedure at each other level one node until the process of qualifying and registering level two nodes has been completed at each level one node. Once the node scan procedure has been performed by each level one node, resulting in a number of level two nodes being registered with the collector 116, the collector 116 will then send the Initiate Node Scan Response command to each level two node, in turn. Each level two node will then perform the same node scan procedure as performed by the level one nodes, potentially resulting in the registration of a number of level three nodes. The process is then performed at each successive node, until a maximum number of levels is reached (e.g., seven levels) or no unregistered nodes are left in the subnet.

It will be appreciated that in the present embodiment, during the qualification process for a given node at a given level, the collector qualifies the last "hop" only. For example, if an unregistered node responds to a node scan request from a level four node, and therefore, becomes a potential level five node, the qualification score for that node is based on the reliability of communications between the level four node and the potential level five node (i.e., packets transmitted by the level four node versus acknowledgments received from the potential level five node), not based on any measure of the reliability of the communications over the full path from the collector to the potential level five node. In other embodiments, of course, the qualification score could be based on the full communication path.

At some point, each meter 114 will have an established communication path to the collector 116 which will be either a direct path (i.e., level one nodes) or an indirect path through one or more intermediate nodes that serve as repeaters. If during operation of the network, a meter 114 registered in this manner fails to perform adequately, it can be assigned a different path or possibly to a different collector 116 as described below.

As previously mentioned, a full node scan can be performed when a collector 116 is first introduced to a network. At the conclusion of the full node scan, a collector 116 will have registered a set of meters 114 with which it communicates and reads metering data. Full node scans might be periodically performed by an installed collector 116 to identify new meters 114 that have been brought on-line since the last node scan and to allow registered meters to switch to a different path.

In addition to the full node scan, the collector 116 can also perform a process of scanning specific meters 114 in the subnet 120, which is referred to as a "node scan retry." For example, the collector 116 can issue a specific request to a meter 114 to perform a node scan outside of a full node scan when on a previous attempt to scan the node, the collector 116 was unable to confirm that the particular meter 114 received the node scan request. Also, a collector 116 can request a node scan retry of a meter 114 when during the course of a full node scan the collector 116 was unable to read the node scan data from the meter 114. Similarly, a node scan retry will be performed when an exception procedure requesting an immediate node scan is received from a meter 114.

The system 110 also automatically reconfigures to accommodate a new meter 114 that can be added. More particularly, the system identifies that the new meter 114 has begun operating and identifies a path to a collector 116 that will become responsible for collecting the metering data. Specifically, the new meter 114 will broadcast an indication that it is unregistered. In one embodiment, this broadcast might be, for example, embedded in, or relayed as part of a request for an update of the real time as described above. The broadcast will be received at one of the registered meters 114 in proximity to the meter that is attempting to register. The registered meter 114 forwards the time to the meter 114 that is attempting to register. The registered node also transmits an exception request to its collector 116 requesting that the collector 116 implement a node scan, which presumably will locate and register the new meter. The collector 116 then transmits a request that the registered node perform a node scan. The registered node will perform the node scan, during which it requests that all unregistered nodes respond. Presumably, the newly added, unregistered meter will respond to the node scan. When it does, the collector will then attempt to qualify and then register the new node in the same manner as described above.

Once a communication path between the collector 116 and a meter 114 is established, the meter 114 can begin transmitting its meter data to the collector 116 and the collector 116 can transmit data and instructions to the meter 114. As mentioned above, data is transmitted in packets. "Outbound" packets are packets transmitted from the collector to a meter at a given level. In one embodiment, outbound packets contain the following fields, but other fields can also be included:

Length—the length of the packet;
SrcAddr—source address—in this case, the ID of the collector;
DestAddr—the LAN ID of the meter to which the packet addressed;
RptPath—the communication path to the destination meter (i.e., the list of identifiers of each repeater in the path from the collector to the destination node); and
Data—the payload of the packet.

The packet can also include integrity check information (e.g., CRC), a pad to fill-out unused portions of the packet and other control information. When the packet is transmitted from the collector 116, it will only be forwarded on to the destination meter 114 by those repeater meters 114 whose identifiers appear in the RptPath field. Other meters 114 that can receive the packet, but that are not listed in the path identified in the RptPath field will not repeat the packet.

"Inbound" packets are packets transmitted from a meter 114 at a given level to the collector 116. In one embodiment, inbound packets contain the following fields, but other fields can also be included:

Length—the length of the packet;
SrcAddr—source address—the address of the meter that initiated the packet;
DestAddr—the ID of the collector to which the packet is to be transmitted;
RptAddr—the ID of the parent node that serves as the next repeater for the sending node;
Data—the payload of the packet;

Because each meter 114 knows the identifier of its parent node (i.e., the node in the next lower level that serves as a repeater for the present node), an inbound packet need only identify who is the next parent. When a node receives an inbound packet, it checks to see if the RptAddr matches its own identifier. If not, it discards the packet. If so, it knows that it is supposed to forward the packet on toward the collector. The node will then replace the RptAddr field with the identifier of its own parent and will then transmit the packet so that its parent will receive it. This process will continue through each repeater at each successive level until the packet reaches the collector 116.

For example, suppose a meter 114 at level three initiates transmission of a packet destined for its collector 116. The level three node will insert in the RptAddr field of the inbound packet the identifier of the level two node that serves as a repeater for the level three node. The level three node will then transmit the packet. Several level two nodes can receive the packet, but only the level two node having an identifier that matches the identifier in the RptAddr field of the packet will acknowledge it. The other will discard it. When the level two node with the matching identifier receives the packet, it will replace the RptAddr field of the packet with the identifier of the level one packet that serves as a repeater for that level two packet, and the level two packet will then transmit the packet. This time, the level one node having the identifier that matches the RptAddr field will receive the packet. The level one node will insert the identifier of the collector in the RptAddr field and will transmit the packet. The collector will then receive the packet to complete the transmission.

A collector 116 periodically retrieves meter data from the meters 114 that are registered with it. For example, meter data can be retrieved from a meter every 4 hours. Where there is a problem with reading the meter data on the regularly scheduled interval, the collector 116 will try to read the data again before the next regularly scheduled interval. Nevertheless, there can be instances wherein the collector 116 is unable to read metering data from a particular meter 114 for a prolonged period of time. The meters 114 store an indication of when they are read by their collector 116 and keep track of the time since their data has last been collected by the collector 116. If the length of time since the last reading exceeds a defined threshold, such as for example, 18 hours, presumably a problem has arisen in the communication path between the particular meter 114 and the collector 116. Accordingly, the meter 114 changes its status to that of an unregistered meter and attempts to locate a new path to a collector 116 via the process described above for a new node. Thus, the example system is operable to reconfigure itself to address inadequacies in the system.

In some instances, while a collector 116 can be able to retrieve data from a registered meter 114 occasionally, the level of success in reading the meter can be inadequate. For example, if a collector 116 attempts to read meter data from a meter 114 every 4 hours but is able to read the data, for example, only 70 percent of the time or less, it can be desirable to find a more reliable path for reading the data from that particular meter. Where the frequency of reading data from a meter 114 falls below a desired success level, the collector 116 transmits a message to the meter 114 to respond to node scans going forward. The meter 114 remains registered but will respond to node scans in the same manner as an unregistered node as described above. In other embodiments, all registered meters can be permitted to respond to node scans, but a meter 114 will only respond to a node scan if the path to the collector 116 through the meter 114 that issued the node scan is shorter (i.e., less hops) than the meter's current path to the collector 116. A lesser number of hops is assumed to provide a more reliable communication path than a longer path. A node scan request always identifies the level of the node that transmits the request, and using that information, an already registered node that is permitted to respond to node scans can determine if a potential new path to the collector 116 through the node that issued the node scan is shorter than the node's current path to the collector 116.

If an already registered meter 114 responds to a node scan procedure, the collector 116 recognizes the response as originating from a registered meter 114 but that by re-registering the meter 114 with the node that issued the node scan, the collector 116 can be able to switch the meter to a new, more reliable path. The collector 116 can verify that the RSSI value of the node scan response exceeds an established threshold. If it does not, the potential new path will be rejected. However, if the RSSI threshold is met, the collector 116 will request that the node that issued the node scan perform the qualification process described above (i.e., send a predetermined number of packets to the node and count the number of acknowledgements received). If the resulting qualification score satisfies a threshold, then the collector 116 will register the node with the new path. The registration process comprises updating the collector 116 and meter 114 with data identifying the new repeater (i.e. the node that issued the node scan) with which the updated node will now communicate. Additionally, if the repeater has not previously performed the operation of a repeater, the repeater would need to be updated to identify that it is a repeater. Likewise, the repeater with which the meter previously communicated is updated to identify that it is no longer a repeater for the particular meter 114. In other embodiments, the threshold determination with respect to the RSSI value can be omitted. In such embodiments, only the qualification of the last "hop" (i.e., sending a predetermined number of packets to the node and counting the number of acknowledgements received) will be performed to determine whether to accept or reject the new path.

In some instances, a more reliable communication path for a meter can exist through a collector other than that with which the meter is registered. A meter can automatically recognize the existence of the more reliable communication path, switch collectors, and notify the previous collector that the change has taken place. The process of switching the registration of a meter from a first collector to a second collector begins when a registered meter 114 receives a node scan request from a collector 116 other than the one with which the meter is presently registered. Typically, a registered meter 114 does not respond to node scan requests. However, if the request is likely to result in a more reliable transmission path, even a registered meter can respond. Accordingly, the meter determines if the new collector offers a potentially more reliable transmission path. For example, the meter 114 can determine if the path to the potential new collector 116 comprises fewer hops than the path to the collector with which the meter is registered. If not, the path can not be more reliable and the meter 114 will not respond to the node scan. The meter 114 might also determine if the RSSI of the node scan packet exceeds an RSSI threshold identified in the node scan information. If so, the new collector can offer a more reliable transmission path for meter data. If not, the transmission path can not be acceptable and the meter can not respond. Additionally, if the reliability of communication between the potential new collector and the repeater that would service the meter meets a threshold established when the repeater was registered with its existing collector, the communication path to the new collector can be more reliable. If the reliability does not exceed this threshold, however, the meter 114 does not respond to the node scan.

If it is determined that the path to the new collector 116 can be better than the path to its existing collector 116, the meter 114 responds to the node scan. Included in the response is information regarding any nodes for which the particular meter can operate as a repeater. For example, the response might identify the number of nodes for which the meter 114 serves as a repeater.

The collector 116 then determines if it has the capacity to service the meter 114 and any meters for which it operates as a repeater. If not, the collector 116 does not respond to the meter 114 that is attempting to change collectors 116. If, however, the collector 116 determines that it has capacity to service the meter 114, the collector 116 stores registration information about the meter 114. The collector 116 then transmits a registration command to meter 114. The meter 114 updates its registration data to identify that it is now registered with the new collector 116. The collector 116 then communicates instructions to the meter 114 to initiate a node scan request. Nodes that are unregistered, or that had previously used meter 114 as a repeater, respond to the request to identify themselves to collector 116. The collector 116 registers these nodes as is described above in connection with registering new meters/nodes.

Under some circumstances it can be necessary to change a collector 116. For example, a collector 116 can be malfunctioning and need to be taken off-line. Accordingly, a new communication path is provided for collecting meter data from the meters 114 serviced by the particular collector. The process of replacing a collector 116 is performed by broadcasting a message to unregister, usually from a replacement collector 116, to all of the meters 114 that are registered with the collector 116 that is being removed from service. In one embodiment, registered meters 114 can be programmed to only respond to commands from the collector 116 with which they are registered. Accordingly, the command to unregister can comprise the unique identifier of the collector 116 that is being replaced. In response to the command to unregister, the meters 114 begin to operate as unregistered meters and respond to node scan requests. To allow the unregistered command to propagate through the subnet, when a node receives the command it will not unregister immediately, but rather remain registered for a defined period, which can be referred to as the "Time to Live". During this time to live period, the nodes continue to respond to application layer and immediate retries allowing the unregistration command to propagate to all nodes in the subnet. Ultimately, the meters register with the replacement collector using the procedure described above.

One of collector's 116 main responsibilities within subnet 120 is to retrieve metering data from meters 114. In one embodiment, collector 116 has as a goal to obtain at least one successful read of the metering data per day from each node in its subnet. Collector 116 attempts to retrieve the data from all nodes in its subnet 120 at a configurable periodicity. For example, collector 116 can be configured to attempt to retrieve metering data from meters 114 in its subnet 120 once every 4 hours. In greater detail, in one embodiment, the data collection process begins with the collector 116 identifying one of the meters 114 in its subnet 120. For example, collector 116 can review a list of registered nodes and identify one for reading. The collector 116 then communicates a command to the particular meter 114 that it forward its metering data to the collector 116. If the meter reading is successful and the data is received at collector 116, the collector 116 determines if there are other meters that have not been read during the present reading session. If so, processing continues. However, if all of the meters 114 in subnet 120 have been read, the collector waits a defined length of time, such as, for example, 4 hours, before attempting another read.

If during a read of a particular meter, the meter data is not received at collector 116, the collector 116 begins a retry procedure wherein it attempts to retry the data read from the particular meter. Collector 116 continues to attempt to read the data from the node until either the data is read or the next subnet reading takes place. In an embodiment, collector 116 attempts to read the data every 60 minutes. Thus, wherein a subnet reading is taken every 4 hours, collector 116 can issue three retries between subnet readings.

Figure 4:
FIG. 4 is a diagram illustrating an example communication packet format.

As mentioned above, a system, such as the communication system 110 described above, can include communications between any node (e.g., a meter or a collector) to any other node (e.g., a meter or a collector) that are performed using an FHSS technique. As mentioned above, in the example communication system described above, data is transmitted in the form of packets. FIG. 4 illustrates the general packet format. As shown, each packet consists of a preamble, followed by a start frame delimiter (SFD), followed by a data section (which can have one of the formats mentioned above for outbound and inbound transmissions).

In the example system, twenty-five different channels (frequencies) are employed in a pseudo-random sequence. Each packet is transmitted in its entirety on one channel. The next packet will then be transmitted on the next channel in the sequence, and so on. Transmissions are asynchronous, and thus a receiving node listens on a given channel for a transmitted preamble, followed by a start frame delimiter and then the data. It is understood, however, that in other embodiments a different number of channels can be employed and different variations on the FHSS technique can also be employed. The present invention is by no means limited to the disclosed example.

Figure 5:
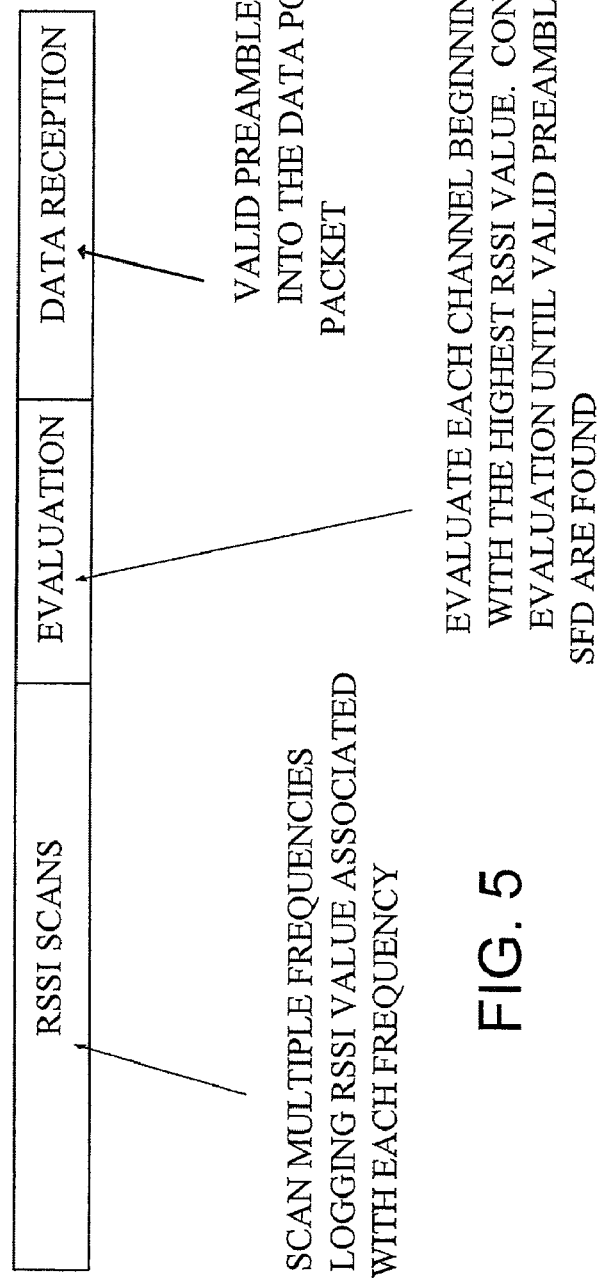
FIG. 5 is a diagram illustrating one embodiment of a method of the present invention.

According to one aspect of the invention, a digital receiver, such as the LAN communications circuitry 306', of a given node, which as mentioned above can be implemented using the Texas Instruments CC1110 transceiver, scans each of the potential channels available (e.g., each of the 25 channels in the example FHSS sequence mentioned above) and generates an RSSI value for each channel that reflects detected signal strength on that channel. This process can be repeated a number of times, such as, for example, four times, to ensure a valid RSSI value on each channel. The channels are then ranked from strongest RSSI to lowest. When the digital receiver is ready to begin listening for transmitted packets, it will begin listening on the channel having the strongest RSSI. If it does not detect a preamble, it will then select the channel with the next strongest RSSI and so on until it finds a valid preamble and SFD on a channel. The receiver 306' will then attempt to detect a valid SFD. If one is detected, the receiver will then proceed to receive the data of the packet. If the packet is intended to be received by that node (e.g., it is addressed to it), the data will be processed accordingly. FIG. 5 generally illustrates the process.

In greater detail, typically the RSSI output value from the receiver 306' will vary linearly as the signal level increases from −100 dBm to −20 dBm. The RSSI scan consists of setting an RF channel, waiting for the RSSI value to stabilize and then reading the RSSI value. This procedure is used for each of the channels in the FHSS sequence or list. Because of the time uncertainty associated with the transmitted signal, the full channel scan is repeated multiple times (e.g., four times) to gain assurance that the signal can be detected. During each RSSI scan of all the communication channels, the strongest RSSI values are tagged to the specific channel and are logged for later use. After accomplishing the RSSI scans, the process changes to the evaluation phase of the algorithm. For the evaluation phase, the RSSI values are ordered from the strongest channel to the weakest channel. As mentioned above, when the digital receiver 306' is ready to begin listening for transmitted packets, it will begin listening on the channel having the strongest RSSI. If it does not detect a preamble, it will then select the channel with the next strongest RSSI and so on until it finds a valid preamble and SFD on a channel.

Some digital receivers can not handle overload in a manner that allows data to be detected in the presence of strong signals. According to another aspect of the invention, attenuation can be inserted into the receiver path in order to keep the desired signal within the range of operation of the receiver (e.g., −110 dBm to −20 dBm). Specifically, in one embodiment, beginning with the strongest RSSI channel developed in the scan process described above, the algorithm checks to see if the RSSI value is above a threshold. The threshold represents the signal strength above which there is concern about the validity of the data. This level can be determined empirically for the design or from the specification sheet for the receiver, or both.

If the channel RSSI exceeds the threshold, the algorithm inserts a fixed amount of attenuation into the receiver loop prior to evaluating the data output signal of the radio. For example, for a receiver that operates properly over a range of −110 dBm to −20 dBM, if signal strength is detected above −20 dBM, for example, then 20 dBM of attenuation can be inserted to bring the signal into the receiver's range. If the signal is below the threshold, the signal is left as is prior to evaluating the data. In either the case of the unaltered signal with RSSI below the threshold or in the case of the reduced signal with RSSI above the threshold, the receiver evaluates several bits of data looking for a valid preamble. If a valid preamble is detected, the receiver continues to monitor that channel looking for a start frame delimiter (SFD). Once the SFD is recognized the data contents of the packet can be read.

As noted above, if a valid preamble is not found in the strongest RSSI channel evaluated for valid bits, the second strongest RSSI channel is selected for evaluation. Again, if the signal is below the RSSI threshold it is left unaltered and if the signal is above the threshold the signal is attenuated before being evaluated. The above evaluation procedure is followed through the SFD and data if a valid preamble is found. If valid preamble is not located, the third strongest RSSI channel is evaluated in a similar manner, and so on. Using this technique with sufficient preamble length a detailed analysis of the majority of all the FHSS channels can be evaluated to find the active communication channel.

In accordance with another aspect of the present, it may be desirable to monitor the power across the communication network 110 for the purposes of identifying indications of system irregularities that may affect the power supply to the residence or place of business that is associated with a given meter 114. The meters 114 thus sample the input (also referred to herein as "line") voltages across lines L1 and L2, and periodically determine an input voltage to be used to monitor the input voltage. In one embodiment, the meters 114 can monitor and store information related to the input voltage, can record maximum and minimum voltages, and can further determine whether the input voltage indicates a voltage irregularity.

Unless otherwise specified herein, it should be appreciated that the term "voltage," when used herein in the context of an input or line voltage used for the purposes of voltage monitoring, can be determined as an average voltage, a continuous voltage, or a periodic sampling (at regular or irregular intervals), or any other alternative representation of the sampled line voltage. For instance, when monitoring the line voltage, and the monitored voltage is in the form of an average rms voltage, the average voltage can be a fast-moving average (for instance 32 line cycles) or a slow average (for instance 8192 line cycles). The numbers of line cycles that can be used when calculating average voltage values are presented by way of example only, and the number of line cycles used to calculate the average voltage can be as desired. When the monitored voltage is in the form of a continuous voltage, each line cycle is measured instantaneously. When the monitored voltage is in the form of a periodic voltage, the line voltage may be determined periodically, for instance at every $20^{th}$ line cycle (or at any suitable alternative line cycle). It can thus be said that the meters 114 periodically determine voltage values from the sampled voltage across lines L1 and L2. The type of voltage to be determined can be set locally at each meter 114 via the interface 319', or can be communicated to each meter 114 on each subnet/LAN 120.

The meters 114 can then send voltage-related data to the collector 116 either voluntarily (for instance at a predetermined time or upon occurrence of a detection of a voltage irregularity), or in response to a request from the collector 116. The collector 116 can thus read the information received from each associated meter 114 and determine, for instance, based on the unique identification of each meter that has experienced or is experiencing a voltage irregularity, whether a certain geographic region on the subnet 120 is experiencing power difficulties. Knowledge of the geographic location of the voltage irregularity can assist in the diagnosing and repairing the cause of the voltage irregularities.

Alternatively, or additionally, each collector 116 in the network 112 can send information to the data collection server 206 indicating 1) that a voltage irregularity should be investigated, and 2) the geographical location of the voltage irregularity and/or the identifiers for each meter reporting a voltage irregularity. Based on the locations of each of the meters 114 reporting an irregularity, the collection server 206 can then determine the geographical region or regions in the network 110 that may be experiencing a voltage irregularity.

Figure 6:
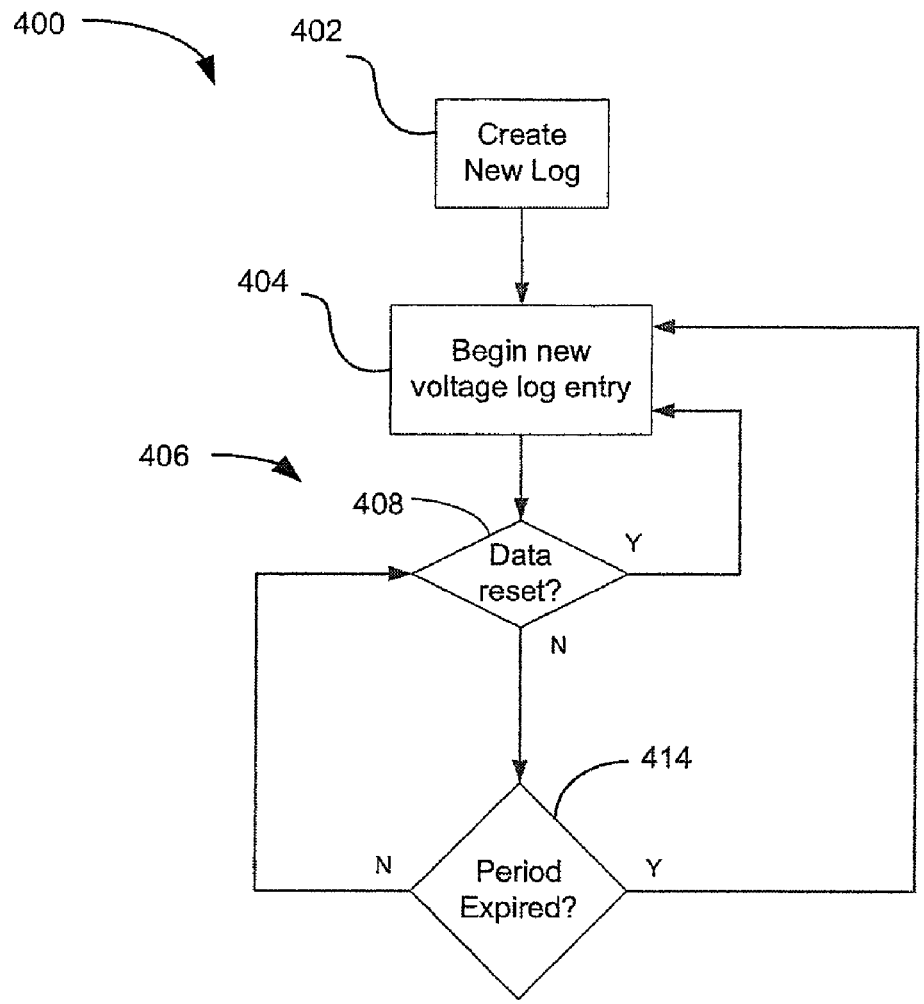
FIG. 6 is a flowchart schematically illustrating a method for creating voltage log entries that store voltage-related information for each meter in accordance with the principles of certain aspects of the present invention.

The determination that a voltage irregularity should be investigated can be based on a single meter 114 reporting a voltage irregularity, or a predetermined number of meters 114 reporting a voltage irregularity within a given geographic locale. An example method 400 for monitoring voltage as performed by the meter 114 in each subnet/LAN 120 will now be described with reference to FIGS. 6, 9, and 10.

Specifically, the meter 114 begins the method 400 by creating a new voltage log 460 in the meter memory 312' (See FIG. 3B) at step 402. The voltage log 460 is configured to store a plurality of voltage log entries 462 that each contain information related to the line voltage. Once the voltage log 460 has been created, the meter 114 initiates a new voltage log entry at step 404. When each new voltage log entry 462 is created, the memory 312' is cleared of line voltage-related data that had been previously calculated or determined in combination with the previous voltage log entry.

The memory 312' is configured to store a predetermined number of voltage log entries 462 in the voltage log 460. The number of voltage log entries stored in the memory 312' can be determined based on a number of factors including the memory capacity, and the frequency at which voltage entry data are communicated to the collector 116. In accordance with one aspect of the method 400, each voltage log entry 462 can be forwarded to the collector 116 before being erased from the memory 312'. In one embodiment of the present invention, the meter 114 can store any desired number of voltage log entries 462 at a given point in time depending on the memory capacity. Once the maximum number of voltage log entries 462 has been stored, the meter 114 will erase the oldest entries 462 as new entries 462 are created. In this manner, the collector 116 can receive data related to all voltage log entries 462 before the voltage log entries 462 are erased.

Typically, voltage log entries 462 are intended to be created over a configurable log entry duration that can be predetermined, such as a predetermined period of time. While the log entry duration can be configured as any time duration as desired, certain aspects of the present invention provide log entry durations as periods of time that can be evenly divisible by a multiple of 24-hour periods (for example, one or more days) or can be evenly divisible into a 24-hour period (for example., 4 hours, 6 hours, 8 hours, 12 hours, and the like) such that at least a portion of the monitoring periods can align with day boundaries. Each meter 114 keeps the network time as a clock (such as clock 322' illustrated in FIG. 3B) that counts since the most recent midnight. Once the entry duration expires, a new voltage log entry 462 can be created. Accordingly, for 8 hour entry periods, the first log entry 462 is intended to begin at midnight, the second log entry 462 is intended to begin at 08:00, and the third log entry is intended to begin at 16:00. A fourth log entry is intended to begin the following day at midnight (or 0:00), and so on. It should be appreciated, however, that any alternative method of tracking time could be utilized in accordance with the principles of the present invention. For instance, the clock 322' could keep track of standard time, and the entry periods could be set to begin and end at predetermined standard times.

The log entry duration can be set locally at each meter 114 via the interface 319', or can be communicated to each meter on each subnet/LAN 120 from the collector 116, network, management server 202, or other remote device. In this regard, certain aspects of the present invention recognize that configurable information usable by the meters 114, unless otherwise specified herein, can be set locally at the meter upon manufacture, via the meter interface 319', or via communications from the collector 116, network management server 202, or other remote device. One may wish to configure the log entry duration locally, for instance, upon manufacture of the meters 114 to reduce the efforts required on the part of the end user. In accordance with one aspect of the present invention, all meters 114 on a given subnet/LAN can keep the same network time, use the same entry period, and are thus synchronized. The creation and updating of the voltage log entries 462 will be described in more detail below with reference to FIG. 7.

Once the new voltage log entry has been created in the memory 312' at step 404, the microcontroller 305' can operate a stored program, which can be firmware-based, software-based, or the like, to determine when to create the next voltage log entry. It should be appreciated that prior voltage log entries retain their stored data until they are erased from the memory 312', but that new voltage-related information is stored in the most recently created voltage log entry. However, the method 400 recognizes that certain events may cause a period to terminate prior to expiration of the entry duration. If none of those events occur, then the prior terminates upon the expiration of the entry duration. Accordingly, the method 400 performs a loop 406 that determines whether conditions exist to revert to step 404 and begin a new voltage log entry.

For instance, the interface 319' can provide a data reset, or "clear data" button that causes the meter 114 to begin a new voltage log entry. A user may actuate the data reset button, for instance, when the meter 114 is manufactured, when a new meter is added on the subnet/LAN 120, or when meter configurations are to be changed. Alternatively, the collector 116 can send a "data reset" message to the meters 114 that cause those meters receiving the message to begin a new voltage log entry. Accordingly, after the new voltage log entry is initiated at step 404, the process continues to decision block 408 to determine whether the data reset interface has been actuated. Alternatively, the microcontroller 305' can generate a reset signal to the meter 114 the when the data is set to be cleared regardless of what step is being performed in the method 400. If the data has been reset, then the method 400 reverts to step 404 and begins a new voltage log entry.

Otherwise, the method 400 continues to decision block 414 where it is determined whether the period of the current voltage log entry has expired. If so, the process reverts to step 404 and begins a new voltage log entry. Otherwise, if the period of the current voltage log entry has not yet expired, then the method 400 reverts to decision block 408 and the loop 406 repeats until a condition is found to exist that causes the meter 114 to create a new voltage log entry.

Aspects of the present invention recognize that the meters 114 and the collector 116 in each subnet/LAN 120 can each maintain the system time locally (and are thus synchronized). Each meter 114 can be provided with a backup power source such as a battery if desired. In such circumstances, meters 114 will remain operational during a power outage. However, the present invention further recognizes that the meters 114 might not be provided with such backup power sources, or that the backup power source can become inoperable (for instance a dead battery). Certain aspects of the present invention thus contemplate power outages that can be experienced at the meter 114.

If a meter 114 experiences a power failure, when power is restored the meter will consequently lose the real time until the time is received on the subnet/LAN 120 network. For instance, in response to a power outage, the meter 114 can send a message to the collector 116 requesting the system time. Alternatively, the collector 116 can send broadcast messages to all meters 114 indicating the system time, for instance at regular intervals. Once the meter 114 receives the message from the collector, the clock 322' can be updated with the valid time.

However, once power is restored and before the clock 322' receives the network time, the clock 322' can begin counting forward as if power to the meter was restored at midnight (or 0:00). Because the time kept by the clock 322' has not been verified on the subnet/LAN 120, the meter 114 is said to keep "relative time" from 0:00.

Figure 7:
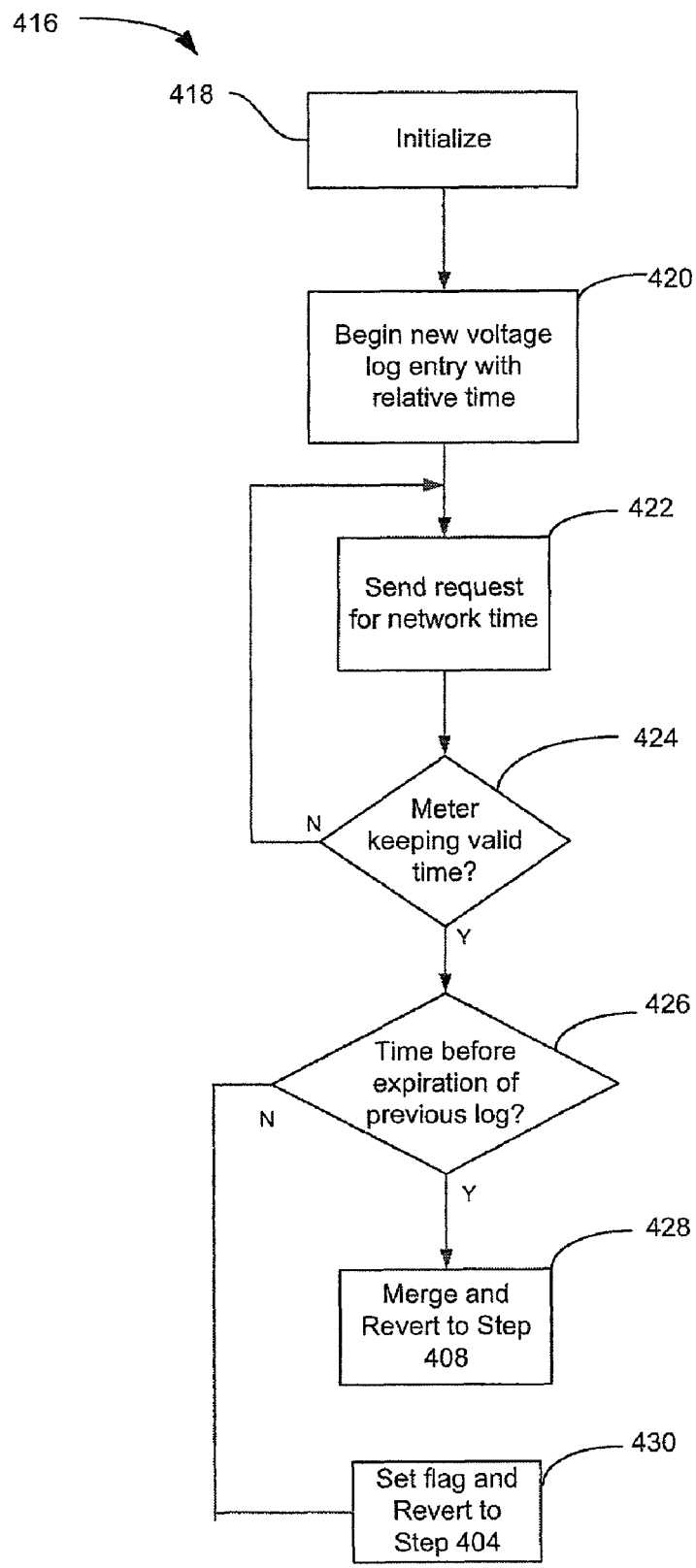
FIG. 7 is a flowchart schematically illustrating a power outage routine performed by each meter in accordance with the principles of certain aspects of the present invention.

Referring now to FIG. 7, a power restoration routine 416 can be performed concurrently with the method 400 described above with reference to FIG. 6, and with the voltage monitoring method 432 described below with reference to FIG. 8. The power restoration routine 416 begins at step 418 where the meter is initialized, either because the power has been restored or a meter has been brought online. Next, at step 420, the meter begins a new voltage log entry 462 based on relative time. Because the meter 114 is keeping relative time, the method 400 of FIG. 6 will not determine that the period has expired at decision block 414. Rather, the meter 400 will continuously monitor the data reset at decision block 408 in the manner described above.

With continuing reference to FIG. 7, once the new voltage log entry 462 is created at step 420, an "outage" flag can be set in the new log entry to associate the entry with a power restoration. Accordingly, when the voltage log entry 462 is read by the collector 116 or the data collection server 206, the voltage-related data associated with the voltage log entry can be identified accordingly. When the new voltage log entry is created at step 420, the clock 322' is counting on relative time, and will remain on relative time for the duration of the voltage log entry.

Next, at step 422, the meter 114 sends a request for the network time. The request can be sent to the collector 116, or to any node on the subnet/LAN 120. Alternatively, as described above, the meter 114 can receive the network time on the subnet/LAN 120 as broadcast by the collector 116 at regular intervals (for instance every fifteen minutes). At decision block 424, it is determined whether the meter 114 is keeping valid network time. If the meter 114 is not keeping valid time, the power restoration routine 416 reverts to step 422 decision block until either the data is reset (see decision block 408 in FIG. 6) or the meter 114 receives the valid network time. It should be appreciated that the meter 114 need not necessarily send requests for network time continuously each time the routine 416 reverts from decision block 424 to step 422, and that the meter can send such requests once or only intermittently.

Once it is determined at decision block 424 that the meter 114 is keeping valid time, the power restoration routine 416 examines the network time and determines at decision block 426 whether the current time is beyond the expiration period of the previous voltage log entry 462 during which the power outage occurred. If not, then the meter can merge the current data log entry 420 with the previous data log entry at step 428. Once the entry logs are merged, the meter 114 ends the power restoration routine 416 and reverts to step 408 of method 400.

Otherwise, if it is determined at step 426 that the network time is beyond the expiration of the previous log entry, then the routine 416 proceeds to step 430. Because the previous voltage log entry 462 was not defined by the boundaries of the entry period, the meter 114 can set a flag in the previous voltage log entry 462 that identifies the voltage log entry as a partial time entry (e.g., not defined by the boundaries of the entry period) at step 430. The meter then ends the power restoration routine 416 and reverts to step 404 where a new voltage log entry is begun on valid time. Because the new voltage log entry is not defined by at least the starting boundary of the entry period, a flag can be set in the new voltage log entry that identifies the new entry as a partial time entry at step 404.

The present invention further contemplates that power outages may be produced by flickering power, and that it may not be desirable to create new voltage logs each time power is temporarily restored. Accordingly, at step 420, it can be determined whether the most recent voltage log entry is associated with the "outage" flag, and thus the result of a power outage. If so, a new voltage entry is not created and the previous voltage log entry can instead be continued in accordance with one aspect of the present invention.

Figure 8:
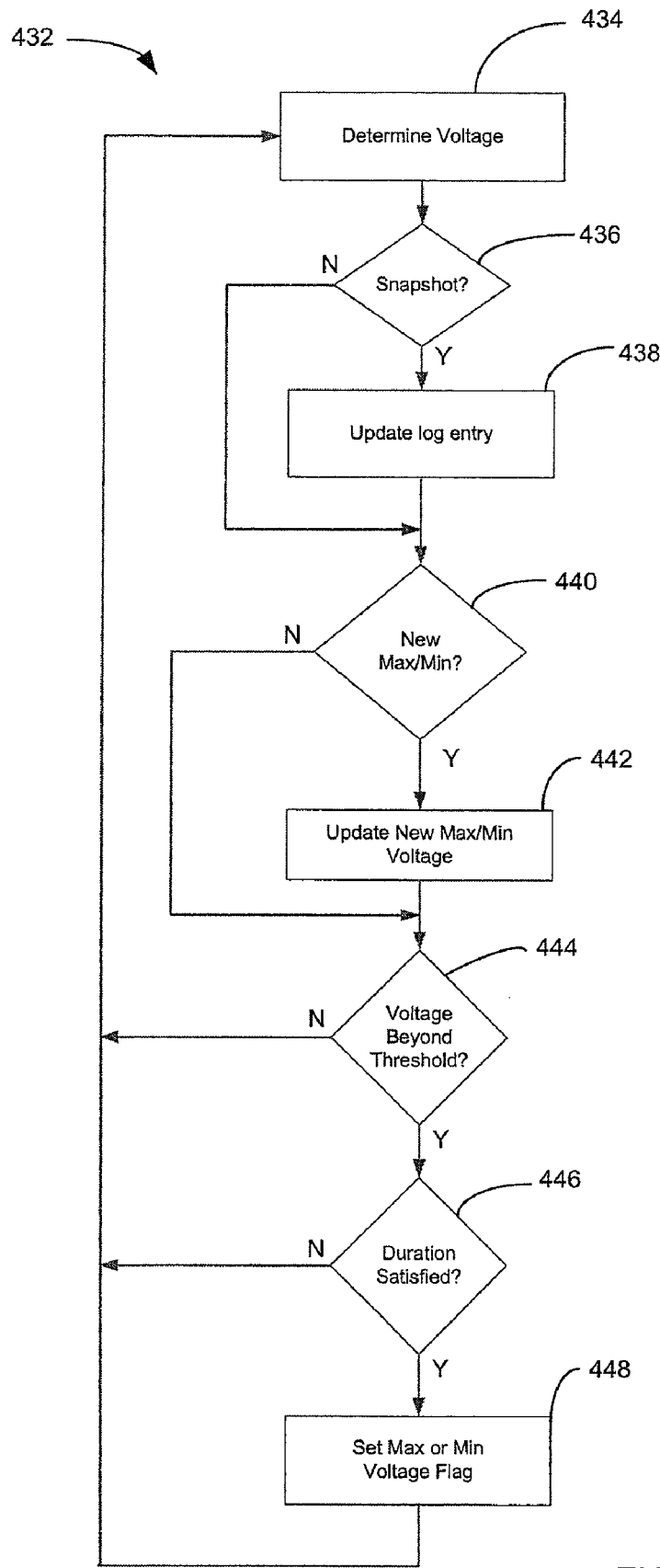
FIG. 8 is a flowchart schematically illustrating a voltage monitoring method in accordance with the principles of certain aspects of the present invention.

Referring now to FIG. 8, a method 432 is provided for monitoring the line voltage. The method 432 can determine whether a new minimum or maximum voltage has been determined. The method 432 can also determine whether the line voltage indicates a voltage irregularity. The method 432 can be performed concurrently with the method 400 described above with reference to FIG. 6, and with method 416 described above with reference to FIG. 7. In this regard, information that is to be stored in a voltage log entry as determined by method 432 is stored in the current voltage log entry as determined by methods 400 and 416.

Figure 10:
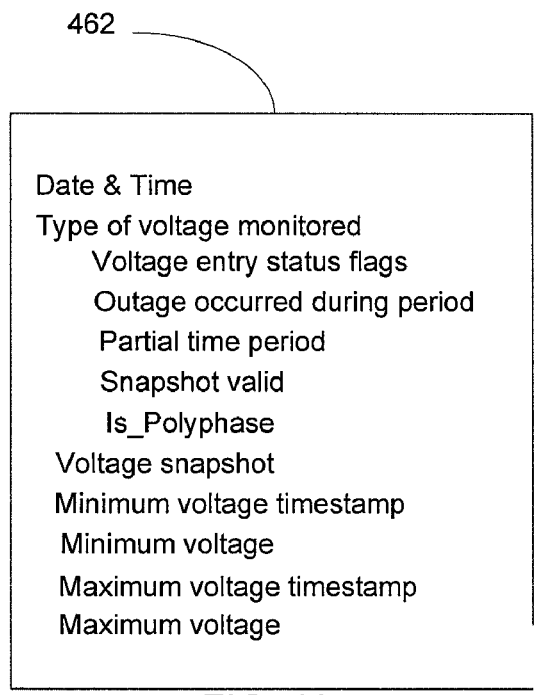
FIG. 10 is a schematic illustration of one of the voltage log entries illustrated in FIG. 9.

As described above, each meter 114 can continuously sample the voltage across the lines L1 and L2. Based on the sampled voltages, the meter 114 can determine the line voltage to be used for voltage monitoring. For instance, the meter 114 can continuously calculate the voltage as an average voltage using either a fast averaging method or a slow averaging method. Alternatively, the determined voltage can be in the form of a continuous voltage or a periodically sampled voltage. The type of voltage being monitored (for instance, fast average or slow average) can be set as a flag in the voltage log entry 462. During the description below, reference is made to the voltage log entry 462, which is illustrated in FIG. 10.

At step 434, the line voltage is sampled and determined in the manner described above. Next, at step 436, it is determined whether the clock time indicates that a snapshot is to be taken. Alternatively, the microcontroller 305' can generate an interrupt signal when the snapshot is to be taken regardless of what step is being performed in the method 432.

A snapshot time can be set for each voltage log entry. For instance, the snapshot can be set to occur upon a predetermined delay of time from the start of the voltage log entry period. The snapshot causes all meters on the subnet/LAN to record the voltage at the same instant in time. With the meters 114 time synchronized, the system snapshot can provide an accurate reflection of the system voltages at a given point in time. If it is determined at decision block 436 that a snapshot is to be taken, the voltage log entry 462 is updated with the snapshot information at step 438. The snapshot information can include, for instance, the voltage that was read at step 434 along with a timestamp corresponding to the voltage snapshot. Because the snapshot was taken at a valid time, a "snapshot valid" status flag can be set in the voltage log entry 462 as well.

Though not illustrated in FIG. 7, each meter 114 can also determine that a snapshot is to be taken during the power restoration routine 416. For instance, once it is determined that the meter is keeping valid time at decision block 424, the meter can determine valid time is beyond the predetermined snapshot time. If so, the meter 114 can take the snapshot. However, the "snapshot valid" flag would not be set in the voltage log entry 462, thereby indicating that the snapshot was taken after the intended snapshot time. Alternatively, a "snapshot invalid" flag (not shown) can be set in the voltage log entry 462 if desired.

If it is determined at decision block 436 that no snapshot is to be taken, or once the voltage log entry has been updated at step 438, the voltage monitoring method 432 advances to decision block 440. The decision block 440 determines whether the voltage read at step 434 is a new minimum or maximum for the voltage log entry.

As voltages are read during the operation of voltage monitoring method 432, it will be determined at decision block 440 whether the voltage is less than the minimum voltage previously stored in the current voltage log entry 462, or greater than the maximum voltage previously stored in the current voltage log entry 462. The minimum voltage will be updated in the voltage log entry at step 442 when the voltage read at step 434 is less than the previously stored minimum voltage. Likewise, the maximum voltage will be updated in the voltage log entry at step 442 when the voltage read at step 434 is greater than the previously stored maximum voltage. Timestamps associated with the minimum and maximum voltages can also be stored in the voltage log entry 462 at step 442. However, if the current voltage log entry 462 is on relative time (e.g., in response to a power outage), a flag without an associated timestamp can be set that associates the new minimum or maximum voltage with the power outage. When a new voltage log entry 462 is created, all data in the log entry is clear. Accordingly, at decision block 440, the first voltage determined at step 434 will be both a new minimum voltage and a new maximum voltage, and the minimum and maximum voltages are updated in the voltage log entry 462 at step 442.

It should be appreciated that the maximum and minimum voltages can be continuously updated in the voltage log entry 462, independent of whether the voltage has crossed a predetermined threshold, and independent of whether the voltage has been maintained at the new minimum or maximum level for a predetermined duration.

If the voltage read at step 434 fails to achieve a new minimum or maximum voltage at decision block 440, or once the minimum or maximum voltage is updated at step 442, method 432 proceeds to decision block 444 which, in combination with decision block 446, determines whether the voltage determined at step 434 indicates that a voltage irregularity in the network may exist.

It should be appreciated that the line voltages on the subnet/LAN 120 are intended to operate at a predetermined voltage, for instance 240V. A voltage irregularity may thus be indicated if the actual line voltage is beyond a configurable predetermined threshold. For instance, the actual voltage may fall below a predetermined minimum threshold, or rise above a predetermined maximum threshold. The thresholds can be set at any desired voltage, for instance a voltage that indicates a predetermined percentage above or below the intended operating voltage. For instance, the minimum voltage can be set at 90% of the operating voltage, or 216V. The maximum voltage can be set at 105% of the operating voltage, or 252V. These values are presented by way of illustration only, and the scope of the present invention is in no way to be construed as being limited to the example minimum and maximum thresholds.

If it is determined that the average voltage is not beyond a predetermined threshold at decision block 444, then the process reverts to step 434, where the line voltage is again determined, and steps 436-444 are repeated. If, however, it is determined that the voltage read at step 434 is less than the minimum voltage threshold, or is greater than the maximum voltage threshold, the method 432 proceeds to decision block 446. Decision block 446 recognizes that the voltage may cross the voltage threshold for a brief period of time that may not be indicative of a voltage irregularity in the subnet/LAN 120. Accordingly, a duration can be configured as, for instance, a period of time or over a predetermined number of read voltages that indicates a greater likelihood that a voltage irregularity has occurred that should be investigated. If it has been determined at decision block 446 that the duration has not been satisfied, the method 432 reverts to step 434 and another voltage is read.

A flag or other indicator can be set in the memory 312' to indicate that the previous voltage was found to be beyond the associated voltage threshold, along with the associated time.

Accordingly, subsequent iterations will allow the meter 114 to determine whether the duration has been satisfied at decision block 446. If the voltage is subsequently found to be within a normal operating range (e.g., between the minimum and maximum thresholds) at step 444, the flag can be cleared.

Once it has been determined at decision block 446 that the duration has been satisfied, a corresponding voltage irregularity flag can be set in the meter memory 312' (see FIG. 11) at step 448. In accordance with one aspect of the present invention, one of two flags can be set. If the actual voltage was less than the minimum voltage threshold for the duration, the "min voltage" flag can be set. If the actual voltage was greater than the maximum voltage threshold for the duration, the "max voltage" flag can be set. In accordance with certain aspects of the present invention, the maximum and minimum voltage threshold flags are stored in the memory 312' but not in the voltage log entries 462. Of course, if desired, the threshold flags could alternatively or additionally be stored in the log entries 462.

Once the voltage irregularity flag has been set, the meter 114 can communicate the flag with the collector 116. The collector 116 can associate a time of the voltage irregularity with the time that the voltage irregularity flag was received from the associated meter 114. Alternatively, each meter 114 can provide a timestamp with the voltage irregularity flag that can be transmitted to the collector 116.

Alternatively or additionally, the collector 116 can constantly ping each meter 114 on the subnet/LAN 120 for voltage irregularity flag status information. Once the meter 114 forwards the voltage irregularity flag to the collector 116, the collector 116 can respond with an acknowledgement that the flag and timestamp have been received, and the flag can then be reset at the meter 114. It should be appreciated that the meters 114 can be configured to clear the voltage irregularity flags once the data associated with the existing flag has been sent to the collector 116 regardless of whether the acknowledgement is received by the collector 116.

Alternatively, the meter 114 can await the acknowledgement from the collector 116 prior to resetting the voltage irregularity flags. Alternatively still, the meters 114 can be configured to activate one of a plurality of maximum and minimum voltage irregularity flags that can be activated without resetting the previous flag if a second voltage irregularity occurs prior to an acknowledgement from the collector 116 that the previous voltage irregularity flag has been received. When the collector 116 receives indications of voltage irregularity flags and associated data that indicate a voltage irregularity, the collector 116 can examine the voltage log entry 462 that corresponds temporally to the voltage irregularity flag to determine the minimum and/or maximum voltages that were read during the period in which the voltage irregularity flag was set.

Relevant information, such as the voltage irregularity flag and the associated time, and the minimum and/or maximum voltage corresponding to the period in which the voltage irregularity flag was set, can be forwarded to the data collection server 206 as desired. The voltage irregularity can be investigated when the collector 116 or the data collection server 206 determines that a voltage irregularity may exist when a predetermined number of meters (for instance, one or more) indicates a voltage irregularity.

Once the appropriate voltage flag is set at step 448, the method 432 reverts to step 434, and the most recently determined voltage is again read and steps 434-448 are repeated.

It should be appreciated that while method 432 determines whether to update the minimum and maximum voltages stored in the voltage log entry 462 prior to determining whether to set the voltage irregularity flag, the method could instead determine whether to set the voltage irregularity flag prior to updating the voltages in the voltage log entry 462. In this regard, it should be appreciated that the various steps illustrated in the methods described herein need not be performed in the precise order illustrated.

Furthermore, while method 432 has been described in combination with a single phase meter, it should be appreciated that the method 432 can be used to monitor the input voltage of a polyphase meter as well. For instance, the input voltage of each phase of the polyphase meter can be determined at step 434, and the snapshot taken at step 438 can include the voltage levels of each phase of the polyphase meter. Likewise, the voltage levels of each phase of the polyphase meter can be monitored at decision block 440, and can be updated as new minimum or maximum voltages in the manner described above with respect to step 442. If either phase produces a new minimum or maximum voltage, the voltages of each phase can be recorded in the log along with an associated time stamp. Furthermore, if it is determined at decision blocks 444 and 446 that the voltage for either phase is less than the minimum voltage threshold, or is greater than the maximum voltage threshold, for the duration, the appropriate flag is set at step 448 in the manner described above for the phase that indicates a voltage irregularity.

Figure 9:
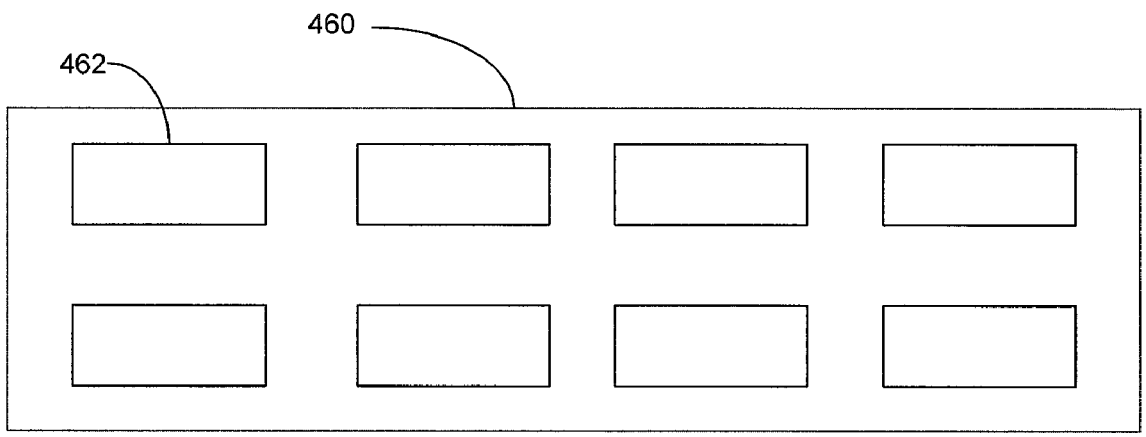
FIG. 9 is a schematic illustration of a voltage log storing a plurality of voltage log entries in accordance with the principles of certain aspects of the present invention.

Referring now to FIGS. 9-10, certain aspects of the present invention provide for the maintaining and updating of a plurality of voltage log entries 462 in the voltage log 460. Each voltage log entry 462 can contain information relevant to the line voltage as determined by the microcontroller 305' of each meter 114. Each voltage log entry 462 can include the date and time corresponding to the voltage log entry, it already being appreciated that the various timestamps stored in the voltage log entry 462 can also indicate the period that the entry corresponds to, unless a power outage has occurred. However, the power outage will be indicated by the activated "outage" flag.

Each voltage log entry will indicate the type of voltage monitored (e.g., type of voltage average), whether a power outage has occurred during the period corresponding to the voltage log entry, whether the entry is a partial time period (for instance, whether the meter 114 was keeping relative time during the entry), whether the meter 114 is a polyphase meter, and whether the snapshot taken for that entry was valid. The voltage log entry 462 can further include a timestamp associated with the snapshot, along with the voltage that was read at the time of the snapshot. The minimum and maximum voltages read are also stored in the voltage log entry, along with the timestamps associated with the minimum and maximum voltages to indicate the time at which the minimum and maximum voltages occurred.

Figure 11:
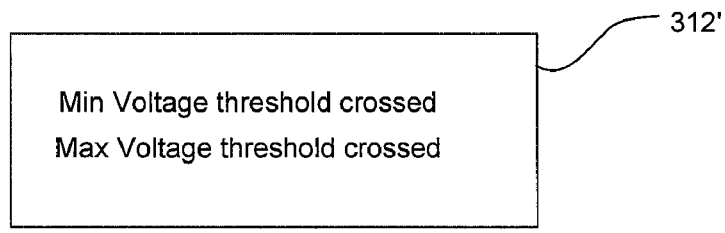
FIG. 11 is a schematic illustration of the meter memory illustrated in FIG. 3B, wherein the meter memory includes an indication of a voltage irregularity.

With further reference to FIG. 11, the meter memory 312' can indicate by way of the minimum and maximum threshold flags whether or not a voltage irregularity has occurred. For instance, as described above, if the line voltage was greater than a predetermined maximum voltage threshold for an entirety of a duration, the "voltage irregularity" flag is set indicating that the maximum voltage threshold has been crossed. If the line voltage was less than a predetermined minimum voltage threshold for an entirety of a duration, the "voltage irregularity" flag is set indicating that the minimum voltage threshold has been crossed. The collector 116 can identify the time associated with the receipt of the voltage irregularity flags, thereby providing sufficient information to determine which voltage log entry or entries are to be investigated to determine the actual minimum and maximum voltages experienced during the entry that was associated with the voltage threshold crossing. Alternatively, a timestamp can be associated with each voltage irregularity flag.

If the maximum or minimum voltage threshold coincides with the determination of the minimum or maximum voltage in the voltage log entry 462, and that minimum or maximum voltage was not subsequently updated in the voltage log entry 462, the actual minimum or maximum voltage that caused the threshold crossing can be determined upon examination of the corresponding log entry 462. Alternatively, the memory 312' can also store the actual voltage value that was determined to be beyond the minimum or maximum voltage threshold. In accordance with one aspect of the present invention, the minimum and maximum thresholds can be set locally at each meter 114 via the interface 319', or can be communicated to each meter on each subnet/LAN 120 by the collector 116, network management server 202, or other remote device.

In accordance with another aspect of the present invention, the collector 116 can send requests over the subnet/LAN 120 that each meter 114 or a select group of meters (based, for instance, on the geographic location of the meters 114) forward the voltage log entries 462 or select data in the voltage log entries 462 that correspond to a specified time or time range. For instance, the requested log entries may have been generated within a specified date range or a time range within one or more dates.

While systems and methods have been described and illustrated with reference to specific embodiments, those skilled in the art will recognize that modification and variations can be made without departing from the principles described above and set forth in the following claims. For example, although in the embodiments described above, the systems and methods discussed above in accordance with certain aspects of the present invention are described in the context of a network of metering devices, such as electricity, gas, or water meters, it is understood that the present invention can be implemented in any kind of network that employs FHSS techniques. Also, while the example metering system described above is a fixed network, the present invention can also be employed in mobile (walk by/drive by) systems. Furthermore, it should be appreciated that certain systems and methods discussed above in accordance with aspects of the present invention can be implemented in any meter, whether or not the meter is included in a meter communication network. Accordingly, reference should be made to the following claims as describing the scope of the present invention.

What is claimed:

1. A method of monitoring voltage in a meter, wherein the meter is one of a plurality of meters in a wireless metering network, the method comprising, at the meter:
   sampling an input voltage;
   periodically determining input voltages from the sampled input voltage;
   identifying that the input voltage is beyond a voltage threshold for an identified duration;
   comparing the identified duration to a predetermined validation duration;
   generating an indication that the input voltage is beyond the voltage threshold when the identified duration is greater than the validation duration; and
   wirelessly communicating the indication to a collector on the network.

2. The method as recited in claim 1, further comprising the step of creating a local voltage log configured to store at least one periodically determined input voltage, wherein the voltage entry includes a minimum input voltage and a maximum input voltage.

3. The method as recited in claim 2, further comprising the step of updating the minimum input voltage in the voltage entry when one of the determined input voltages is less than a previous minimum input voltage, and updating the maximum input voltage in the voltage entry when one of the determined input voltages is greater than a previous maximum input voltage.

4. The method as recited in claim 3, further comprising the step of associating a timestamp with the updated maximum and minimum input voltages.

5. The method as recited in claim 2, wherein the sampling step further comprises sampling the input voltage over a plurality of voltage log entry periods, the method further comprising the step of:
   creating a new voltage log entry in the voltage log when 1) power to the meter fails and subsequently restores, 2) the meter achieves a valid time after restoration of power, or 3) the meter has a valid time and a voltage log entry period boundary is crossed.

6. The method as recited in claim 1, wherein the meter is a polyphase meter, and the input voltage comprises an input voltage for each phase, and the generating step comprises generating an indication when the determined input voltage for one of the phases is beyond the voltage threshold for the validation duration.

7. The method as recited in claim 1, wherein the periodically determining step further comprises averaging the sampled input voltage.

8. The method as recited in claim 1, further comprising the step of configuring one or more of the voltage threshold or the validation duration locally at the meter.

9. The method as recited in claim 1, wherein the voltage threshold comprises one or more of a predetermined maximum voltage and a predetermined minimum voltage, further comprising the step of configuring one or more of the predetermined maximum voltage and predetermined minimum voltage locally at the meter.

10. The method as recited in claim 1, wherein the validation duration comprises one or more of a predetermined number of samples and a predetermined time duration, further comprising the step of configuring one or more of the predetermined number of samples and the predetermined time duration locally at the meter.

11. The method as recited in claim 1, wherein the voltages are sampled over a duration that is divisible into a multiple of a 24 hour period.

12. The method as recited in claim 1, wherein the input voltages comprise average input voltages.

13. A system for monitoring voltage in a wireless network of meters, the system comprising:
   a plurality of meters each receiving respective input voltages, wherein each meter:
      samples an input voltage;
      periodically determines voltage values from the sampled input voltage; and
      generates an indication of a voltage irregularity when at least one of the voltage values is determined to be beyond a voltage threshold for a predetermined duration, and does not generate the indication of the voltage irregularity when the at least one of the voltage values is determined to be beyond the voltage threshold for less than the predetermined duration; and
   a collector communicating wirelessly with each of the plurality of meters to form a fixed wireless metering network, wherein the collector:
      receives generated indications from each of the plurality of meters; and identifies a select group of meters among the plurality of meters, wherein each of the select group of meters has reported an indication.

14. The system as recited in claim 13, wherein each meter stores at least one voltage log entry during the voltage period, wherein the voltage entry includes voltage data, the voltage data including a minimum input voltage and a maximum input voltage.

15. The system as recited in claim 14, wherein the voltage data further includes a timestamp associated with the minimum and maximum input voltages.

16. The system as recited in claim 15, wherein each meter stores the indication in the voltage log entry.

17. The system as recited in claim 16, wherein the collector periodically reads and stores information from at least one of the voltage log entries of each meter.

18. The system as recited in claim 13, wherein the determined voltage values comprise averages of the sampled input voltage.

19. The system as recited in claim 13, wherein each of the plurality of meters generates a synchronized snapshot of voltage-related information.

20. The system as recited in claim 13, wherein the collector communicates with a network management server, and the threshold and the duration are configurable at the meter, the collector, or the network management server.

21. A method of monitoring voltage irregularities among a network of synchronized meters associated with a remote collector station on a meter network, the method comprising the steps of:
monitoring an input voltage at each meter, including:
sampling the input voltage;
determining an average input voltage at a configurable average rate;
generating a threshold indication if the average input voltage is above a predetermined maximum voltage threshold or below a predetermined minimum voltage threshold for a predetermined validation duration; and
generating a voltage log that includes at least one voltage log entry, wherein the voltage log entry includes a determined maximum average voltage from the determined average input voltage and an associated timestamp identifying a real time, and a determined minimum average voltage from the determined average input voltage and an associated timestamp;
experiencing a power outage, and subsequently generating a second voltage log that includes at least one voltage log entry, wherein the voltage log entry includes a determined maximum average voltage and an associated timestap identifying a relative time that is different from the real time, and a determined minimum average voltage and an associated timestamp identifying the relative time;
upon receipt of the real time, generating a third voltage log that includes at least one voltage log entry, wherein the voltage log entry includes a determined maximum average voltage and an associated timestap identifying the real time, and a determined minimum average voltage identifying the real time;
monitoring each meter at the remote collector station, including:
reading at least a portion of the voltage log of each meter; and
identifying a group of meters that have generated the threshold indication among the plurality of meters.

22. The method as recited in claim 21, further comprising the step of configuring the predetermined maximum and minimum voltage thresholds and the predetermined validation duration locally at each meter.

23. A method of monitoring voltage in a meter, wherein the meter is one of a plurality of meters in a wireless metering network, the method comprising, at the meter:
sampling an input voltage over a voltage log entry period;
generating a voltage log entry corresponding to the voltage log entry period, wherein the voltage log entry includes a stored minimum input voltage and a stored maximum input voltage;
continuously determining whether the sampled input voltage is less than the minimum input voltage, or greater than the maximum input voltage;
updating the stored minimum input voltage to the sampled input voltage when the sampled input voltage is less than the stored minimum input voltage;
updating the stored maximum input voltage to the sampled input voltage when the sampled input voltage is greater than the stored maximum input voltage; and
wirelessly communicating the stored minimum and maximum input voltages to a collector on the network.

24. A system for monitoring voltage in a wireless network of meters, the system comprising:
a plurality of meters each receiving respective input voltages, wherein each meter:
samples an input voltage;
periodically determines voltage values from the sampled input voltage;
generates an indication of a voltage irregularity when at least one of the voltage values is determined to be beyond a voltage threshold for a predetermined duration, and does not generate the indication of the voltage irregularity when the at least one of the voltage values is determined to be beyond the voltage threshold for less than the predetermined duration; and
a collector communicating wirelessly with each of the plurality of meters to form a fixed wireless metering network, wherein the collector:
receives generated indications from each of the plurality of meters;
identifies a select group of meters among the plurality of meters, wherein each of the select group of meters has reported an indication,
scans a plurality of channels of a frequency hopping spread spectrum sequence and generates, for each channel, a measure of received signal strength on the channel; and
tunes to the different channels, in order of measured received signal strength, until
a valid transmission is detected on one of the channels,
wherein each meter stores at least one voltage log entry during the voltage period, wherein the voltage entry includes voltage data, the voltage data including a minimum input voltage and a maximum input voltage, and the voltage data further includes a timestamp associated with the minimum and maximum input voltages.

* * * * *